(12) United States Patent
Hirose et al.

(10) Patent No.: US 11,923,655 B2
(45) Date of Patent: Mar. 5, 2024

(54) LIGHT EMISSION DEVICE

(71) Applicant: HAMAMATSU PHOTONICS K.K., Hamamatsu (JP)

(72) Inventors: Kazuyoshi Hirose, Hamamatsu (JP); Yuu Takiguchi, Hamamatsu (JP); Takahiro Sugiyama, Hamamatsu (JP); Yoshitaka Kurosaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 545 days.

(21) Appl. No.: 17/269,313

(22) PCT Filed: Aug. 27, 2019

(86) PCT No.: PCT/JP2019/033568
§ 371 (c)(1),
(2) Date: Feb. 18, 2021

(87) PCT Pub. No.: WO2020/045453
PCT Pub. Date: Mar. 5, 2020

(65) Prior Publication Data
US 2021/0226412 A1 Jul. 22, 2021

(30) Foreign Application Priority Data

Aug. 27, 2018 (JP) ................................. 2018-158242

(51) Int. Cl.
*H01S 5/026* (2006.01)
*H01S 5/11* (2021.01)
(Continued)

(52) U.S. Cl.
CPC .......... *H01S 5/026* (2013.01); *H01S 5/18305* (2013.01); *H01S 5/185* (2021.01);
(Continued)

(58) Field of Classification Search
CPC ....... H01S 5/185–187; H01S 5/18; H01S 5/11
See application file for complete search history.

(56) References Cited

U.S. PATENT DOCUMENTS

2010/0166034 A1\* 7/2010 Ikuta ........................ H01S 5/185
372/45.01
2011/0044365 A1 2/2011 Chen et al.
(Continued)

FOREIGN PATENT DOCUMENTS

CN 105191029 A 12/2015
EP 1371120 B1 \* 5/2013 ......... H01S 5/18355
(Continued)

OTHER PUBLICATIONS

Kurosaka, Yoshitaka, et al., "Effects of non-lasing band in two-dimensional photonic-crystal lasers clarified using omnidirectional band structure," Optics Express, Sep. 2012, vol. 20, No. 19, pp. 21773-21783.
(Continued)

*Primary Examiner* — Joshua King
(74) *Attorney, Agent, or Firm* — Faegre Drinker Biddle & Reath LLP

(57) ABSTRACT

The present embodiment relates to a light emission device capable of removing zero-order light from output light of an S-iPM laser. The light emission device comprises an active layer and a phase modulation layer. The phase modulation layer includes a base layer and a plurality of modified refractive index regions. In a state in which a virtual square lattice is set on the phase modulation layer, a center of gravity of each modified refractive index region is separated from a corresponding lattice point, and a rotation angle around each lattice point that decides a position of the center of gravity of each modified refractive index region is set according to a phase distribution for forming an optical image. A lattice spacing and an emission wavelength satisfy (Continued)

a condition of M-point oscillation in a reciprocal lattice space of the phase modulation layer. A magnitude of at least one of in-plane wavenumber vectors in four directions formed in the reciprocal lattice space and each including a wavenumber spread corresponding to an angle spread of the output light is smaller than $2\pi/\lambda$.

14 Claims, 33 Drawing Sheets

(51) Int. Cl.
*H01S 5/183* (2006.01)
*H01S 5/185* (2021.01)
*H01S 5/343* (2006.01)

(52) U.S. Cl.
CPC .............. *H01S 5/11* (2021.01); *H01S 5/34313* (2013.01); *H01S 5/34353* (2013.01)

(56) References Cited

U.S. PATENT DOCUMENTS

| | | | | |
|---|---|---|---|---|
| 2011/0188526 A1* | 8/2011 | Noda | ...................... | H01S 5/185 372/41 |
| 2012/0002692 A1* | 1/2012 | Noda | ...................... | H01S 5/11 372/43.01 |
| 2012/0114006 A1* | 5/2012 | Kawashima | ............ | H01S 5/185 372/50.12 |
| 2013/0039375 A1* | 2/2013 | Noda | .................. | H01S 5/04256 372/44.01 |
| 2013/0243026 A1* | 9/2013 | Noda | .................... | H01S 5/1234 372/50.12 |
| 2014/0064310 A1* | 3/2014 | Chua | ........................ | H01S 5/11 372/45.01 |
| 2016/0036201 A1* | 2/2016 | Takiguchi | ............. | H01S 5/2018 372/45.01 |
| 2016/0248224 A1* | 8/2016 | Noda | ...................... | H01S 5/185 |
| 2016/0261093 A1* | 9/2016 | Noda | .................... | H01S 3/0085 |
| 2018/0026419 A1* | 1/2018 | Hirose | ................ | H01S 5/18394 353/22 |
| 2019/0252856 A1* | 8/2019 | Hirose | .................... | H01S 5/187 |
| 2021/0249842 A1* | 8/2021 | Hirose | ................ | H01S 5/18302 |

FOREIGN PATENT DOCUMENTS

| | | | | | |
|---|---|---|---|---|---|
| JP | 2008-98379 | A | | 4/2008 | |
| JP | 2014-136607 | A | | 7/2014 | |
| JP | 2014-197665 | A | | 10/2014 | |
| JP | 2014197665 | A | * | 10/2014 | ................ H01S 5/11 |
| JP | 2014-236127 | A | | 12/2014 | |
| JP | 2018-026463 | A | | 2/2018 | |
| JP | 2018041832 | A | * | 3/2018 | ............. H01S 5/028 |
| JP | 2019216148 | A | * | 12/2019 | ............. H01S 5/005 |
| WO | WO-2014/136607 | A1 | | 9/2014 | |
| WO | WO-2016148075 | A1 | * | 9/2016 | ......... H01S 5/04256 |
| WO | WO-2018221421 | A1 | * | 12/2018 | ............. G06F 17/14 |

OTHER PUBLICATIONS

Kurosaka, Yoshitaka, et al., "Phase-modulating lasers toward on-chip integration," Scientific Reports, Jul. 2016, vol. 6, 30138.

Liang, Y., et al., "Three-dimensional coupled-wave analysis for square-lattice photonic crystal surface emitting lasers with transverse-electric polarization: finite-size effects." Optics Express vol. 20, 2012, pp. 15945-15961.

Liang, Y., et al., "Three-dimensional coupled-wave analysis for triangular-lattice photonic-crystal surface-emitting lasers with transverse-electric polarization," Optics Express, Jan. 2013, vol. 21, No. 1, pp. 565-580.

Noda, Susumu, et al., "Photonic-Crystal Surface-Emitting Lasers: Review and Introduction of Modulated-Photonic Crystals," IEEE Journal of Selected Topics in Quantum Electronics, vol. 23, No. 6, 2017, 4900107.

Sakai, Kyosuke, et al., "Coupled-Wave Theory for Square-Lattice Photonic Crystal Lasers With TE Polarization," IEEE Journal of Quantum Electronics, May 2010, vol. 46, No. 5, pp. 788-795.

International Preliminary Report on Patentability dated Mar. 11, 2021 for PCT/JP2019/033568.

* cited by examiner

ORIGINAL IMAGE

BEAM PATTERN TO BE OBTAINED

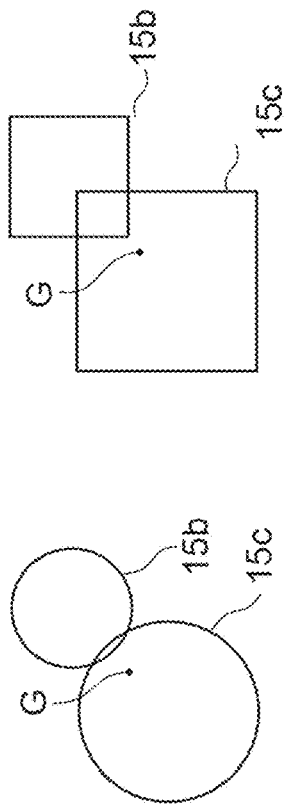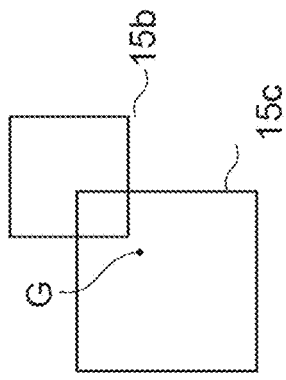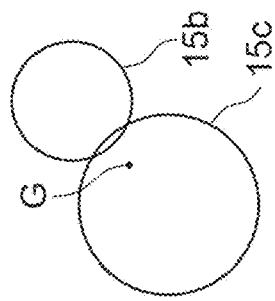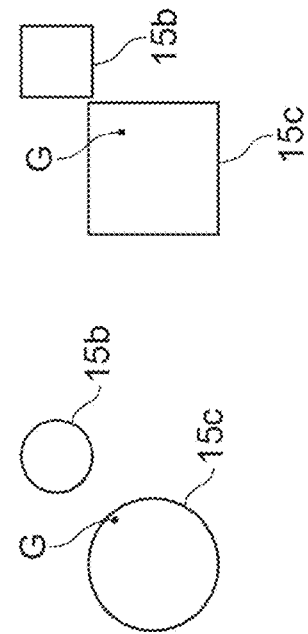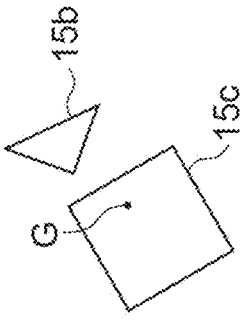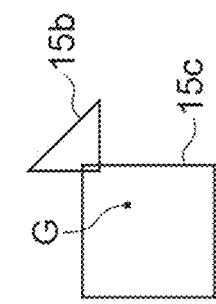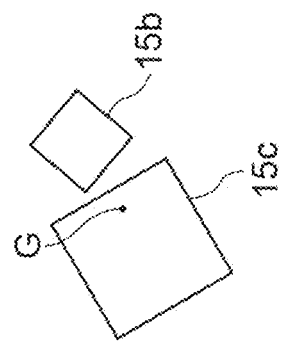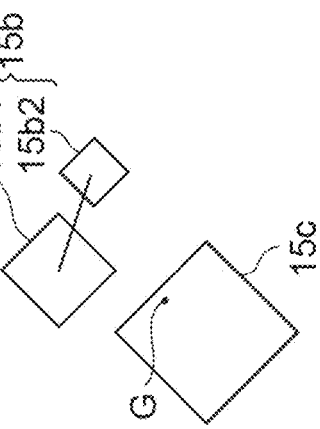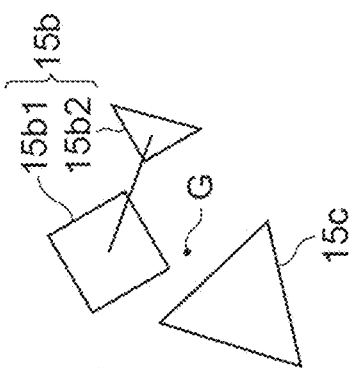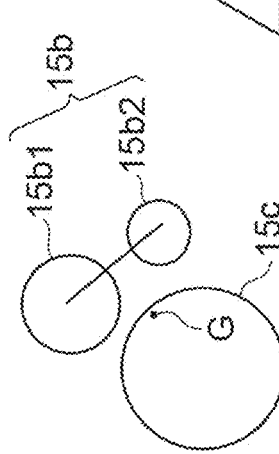

LIGHT EMISSION DEVICE

TECHNICAL FIELD

The present invention relates to a light emission device.

BACKGROUND ART

Semiconductor light emission elements that form any optical image by controlling a phase distribution and an intensity distribution of light outputted from a plurality of light emission points arranged in a two-dimensional shape have been researched. As one of structures of such semiconductor light emission elements, there is a structure including a phase modulation layer optically coupled to an active layer. The phase modulation layer includes a base layer and a plurality of modified refractive index regions having a refractive index different from a refractive index of the base layer. In a virtual square lattice set on a plane perpendicular to a thickness direction of the phase modulation layer, a position of center of gravity of each modified refractive index region correspond is shifted from a corresponding lattice point according to a phase distribution for forming an optical image. Such a semiconductor light emission element is called a static-integrable phase modulating (S-iPM) laser, and an optical image having any two-dimensional shape is formed by light outputted in a normal direction of a main surface of a substrate on which the phase modulation layer is provided and an inclination direction intersecting the normal direction. Non-Patent Document 1 describes a technique related to the S-iPM laser.

CITATION LIST

Non Patent Literature

Non-Patent Document 1: Yoshitaka Kurosaka et al., "Phase-modulating lasers toward on-chip integration", Scientific Reports, 6:30138 (2016).
Non-Patent Document 2: Y. Kurosaka et al., "Effects of non-lasing band in two-dimensional photonic-crystal lasers clarified using omnidirectional band structure," Opt. Express 20, 21773-21783 (2012).
Non-Patent Document 3: Y. Liang et al., "Three-dimensional coupled-wave analysis for square-lattice photonic crystal surface emitting lasers with transverse-electric polarization: finite-size effects," Optics Express 20, 15945-15961 (2012).

SUMMARY OF INVENTION

Technical Problem

The inventors have found the following problems as a result of examining the above-mentioned related arts. That is, normally, the above-mentioned S-iPM laser outputs zero-order light in addition to signal light which is a desired output optical image. This zero-order light is a component of a diffracted wave on which phase modulation is not performed. In the case of Γ-point oscillation of the related art (oscillation operation at a Γ point in the reciprocal lattice space of the phase modulation layer), the zero-order light is spot-shaped light outputted in the normal direction (that is, a direction perpendicular to a light emission surface) of the main surface of the substrate, and is not desirable depending on an application in the S-iPM laser. In particular, there are some cases where intensity unevenness occurs between the zero-order light and another signal light. When the zero-order light becomes noise light in obtaining the desired output optical image, there are some cases where it is desirable to remove the zero-order light from the optical image.

The present invention has been made to solve the above-mentioned problems, and an object of the present invention is to provide a light emission device capable of removing zero-order light included in output light from an S-iPM laser.

Solution to Problem

A light emission device according to the present embodiment is, for example, a device configured to output light forming an optical image along a normal direction of a main surface of a substrate, an inclination direction intersecting the normal direction, or both the normal direction and the inclination direction. As one aspect, the light emission device comprises a light emission portion, and a phase modulation layer provided on the substrate. The phase modulation layer is optically coupled to the light emission portion. The phase modulation layer includes a base layer and a plurality of modified refractive index regions provided in the base layer so as to be distributed in a two-dimensional shape on a plane perpendicular to the normal direction, the plurality of modified refractive index regions having a refractive index different from a refractive index of the base layer. Here, in a state in which a virtual square lattice is set on the plane, each modified refractive index region is arranged in a state of being separated from lattice points corresponding to centers of gravity of each modified refractive index region by a predetermined distance, and a rotation angle around each lattice point in the virtual square lattice (rotation angle of a line segment connecting the center of gravity of each modified refractive index region and the corresponding lattice point with respect to the virtual square lattice) is set according to a phase distribution for forming the optical image. A lattice spacing a of the virtual square lattice and an emission wavelength λ of the light emission portion satisfy an oscillation condition at an M point of symmetric points in a reciprocal lattice space corresponding to a wavenumber space of the phase modulation layer. A magnitude of at least one first in-plane wavenumber vector, out of first in-plane wavenumber vectors in four directions formed in the reciprocal lattice space of the phase modulation layer, is smaller than $2\pi/\lambda$.

Advantageous Effects of Invention

According to the light emission device according to the present embodiment, the zero-order light included in the output of the S-iPM laser is removed from the light line, and thus, the signal light can be outputted into the light line.

BRIEF DESCRIPTION OF DRAWINGS

FIG. 18 is a diagram conceptually illustrating an example of a rotation angle distribution $\varphi_2$(x, y).

FIGS. 31A to 31K are plan views illustrating another example of the shape of the modified refractive index region 15b in the X-Y plane.

DESCRIPTION OF EMBODIMENTS

Description of Embodiment of Present Disclosure

Figure 1:
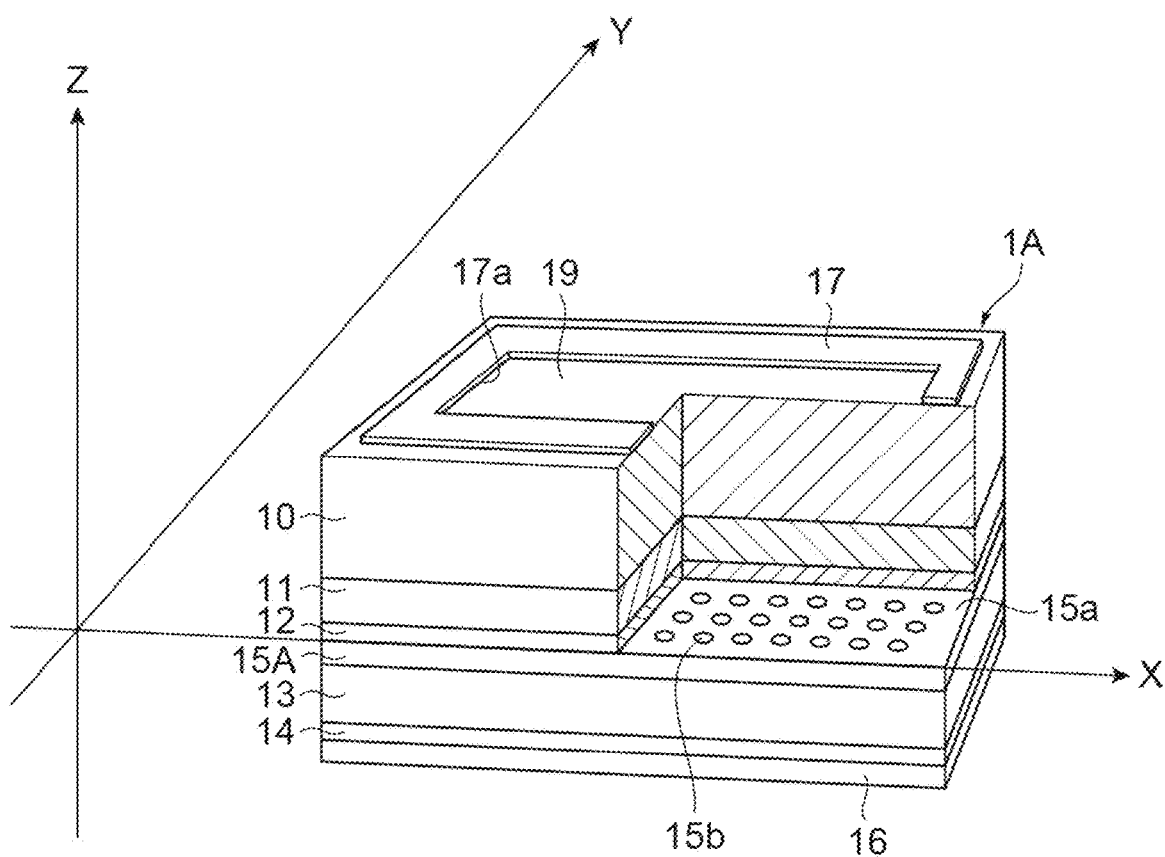
FIG. 1 is a perspective view illustrating a configuration of a semiconductor light emission element 1A as a light emission device according to an embodiment of the present disclosure.

First, contents of an embodiment of the present disclosure will be individually listed and described.

(1) A light emission device according to the present embodiment is a device configured to output light forming an optical image along a normal direction of a main surface of a substrate, an inclination direction intersecting the normal direction, or both the normal direction and the inclination direction. As one aspect, the light emission device comprises a light emission portion, and a phase modulation layer provided on the substrate. The phase modulation layer is optically coupled to the light emission portion. The phase modulation layer includes a base layer and a plurality of modified refractive index regions provided in the base layer so as to be distributed in a two-dimensional shape on a plane perpendicular to the normal direction, the plurality of modified refractive index regions having a refractive index different from a refractive index of the base layer. Here, in a state in which a virtual square lattice is set on the plane, each modified refractive index region is arranged in a state of being separated from lattice points corresponding to centers of gravity of each modified refractive index region by a predetermined distance, and a rotation angle around each lattice point in the virtual square lattice (rotation angle of a line segment connecting the center of gravity of each modified refractive index region and the corresponding lattice point with respect to the virtual square lattice) is set according to a phase distribution for forming the optical image. A lattice spacing a of the virtual square lattice and an emission wavelength λ of the light emission portion satisfy an oscillation condition at an M point of symmetric points (points expressed by a wavenumber vector using a basic reciprocal lattice vector selected such that a magnitude is minimized) in a reciprocal lattice space corresponding to a wavenumber space of the phase modulation layer. A magnitude of at least one first in-plane wavenumber vector, out of first in-plane wavenumber vectors in four directions formed in the reciprocal lattice space of the phase modulation layer, is smaller than 2π/λ.

For example, the phase distribution is a phase distribution in which a first phase distribution for forming the optical image and a second phase distribution unrelated to the formation of the optical image are superimposed, and the second phase distribution is a phase distribution for adding (vector sum) a diffraction vector having certain constant magnitude and orientation to second in-plane wavenumber vectors in four directions in the first phase distribution formed in the reciprocal lattice space of the phase modulation layer. At this time, a magnitude of at least one third in-plane wavenumber vector of third in-plane wavenumber vectors in four directions obtained by adding the diffraction vector to the second in-plane wavenumber vectors in the four directions (in-plane wavenumber vectors corresponding to the first in-plane wavenumber vectors in the four directions) may be set to be smaller than $2\pi/\lambda$.

In the light emission device according to the above-described aspect, the center of gravity of each of the plurality of modified refractive index regions is arranged apart from the corresponding lattice point of the virtual square lattice, and has the rotation angle around the corresponding lattice point set according to the phase distribution for the optical image. According to such a structure, light forming an optical image having any shape along the normal direction of the main surface of the substrate, the inclination direction intersecting the normal direction, or both of the directions can be output as an S-iPM laser. In the light emission device, the lattice spacing a of the virtual square lattice and the emission wavelength $\lambda$ of the light emission portion satisfy the condition of the M-point oscillation. Normally, in a standing wave state of the M-point oscillation, light propagating in the phase modulation layer is totally reflected, and outputs of both the signal light and the zero-order light are suppressed. However, in the light emission device according to the present embodiment, standing waves are phase-modulated according to the phase distribution in the reciprocal lattice space (corresponding to the wavenumber space) of the phase modulation layer, and form the in-plane wavenumber vectors in four directions (may be the first in-plane wavenumber vectors and may each include a wavenumber spread corresponding to an angle spread of output light forming the optical image). A magnitude of at least one of these in-plane wavenumber vectors is smaller than $2\pi/\lambda$ (light line). In the S-iPM laser, such an in-plane wavenumber vector can be adjusted by, for example, adjusting the phase distribution. When the magnitude of at least one in-plane wavenumber vector is smaller than $2\pi/\lambda$, the in-plane wavenumber vector has a component in the normal direction of the main surface of the substrate. Since total reflection does not occur at a boundary with air, a part of the signal light is eventually outputted from the phase modulation layer. However, when the condition of the M-point oscillation is satisfied, the zero-order light is totally reflected at the boundary with the air, and is not outputted into the light line from the phase modulation layer. That is, according to the light emission device according to the present aspect, the zero-order light included in the output of the S-iPM laser is removed from the light line, and thus, only the signal light can be outputted.

(2) As an aspect of the present embodiment, the phase modulation layer includes a base layer and a plurality of modified refractive index regions similar to the above-described aspect. In a state in which a virtual square lattice is set on the plane perpendicular to the normal direction, each modified refractive index region is arranged such that a center of gravity of each modified refractive index region passes through a corresponding lattice point and is positioned on a straight line inclined with respect to the virtual square lattice, and a distance along the straight line between the center of gravity of each modified refractive index region and the corresponding lattice point is set according to a phase distribution for forming the optical image. A lattice spacing a of the virtual square lattice and an emission wavelength $\lambda$ of the light emission portion are set so as to satisfy an oscillation condition at an M point of symmetric points (points expressed by a wavenumber vector using a basic reciprocal lattice vector selected such that a magnitude is minimized) in a reciprocal lattice space corresponding to a wavenumber space of the phase modulation layer. A magnitude of at least one first in-plane wavenumber vector of in-plane wavenumber vectors in four directions (first in-plane wavenumber vectors) formed in the reciprocal lattice space of the phase modulation layer and each including a wavenumber spread corresponding to an angle spread of output light forming an optical image is defined as being smaller than $2\pi/\lambda$.

In the light emission device according to the above-described aspect, the center of gravity of each modified refractive index region passes through the corresponding lattice point of the virtual square lattice and is arranged on a straight line inclined with respect to the square lattice. The distance between the center of gravity of each modified refractive index region and the corresponding lattice point (distance along the straight line) is set according to the phase distribution for forming the optical image. According to such a structure, similar to the aforementioned aspect (structure) having the rotation angle around the lattice point to which the center of gravity of each modified refractive index region correspond, the light forming the optical image having any shape along the normal direction of the main surface of the substrate, the inclination direction intersecting the normal direction can be output as the S-iPM laser. In the light emission device according to the present aspect, the lattice spacing a of the virtual square lattice and the emission wavelength $\lambda$ of the light emission portion satisfy the condition of the M-point oscillation, and the standing waves are phase-modulated according to the phase distribution in the reciprocal lattice space of the phase modulation layer, and form the in-plane wavenumber vectors in the four directions (may be the first in-plane wavenumber vectors and may each include the wavenumber spread corresponding to the angle spread of the output light forming the optical image). The magnitude of at least one of the in-plane wavenumber vectors in the four directions is smaller than $2\pi/\lambda$ (light line). Accordingly, the zero-order light included in the output light from the S-iPM laser is removed from the light line, and thus, only the signal light can be outputted.

(3) As an aspect of the present embodiment, the phase distribution is a phase distribution in which a first phase distribution for forming the optical image and a second phase distribution unrelated to the formation of the optical image are superimposed, and the second phase distribution is a phase distribution for adding (vector sum) a diffraction vector having certain constant magnitude and orientation to second in-plane wavenumber vectors in four directions in the first phase distribution formed in the reciprocal lattice space of the phase modulation layer. The second in-plane vectors in the four directions are in-plane wavenumber vectors in four directions each including a wavenumber spread corresponding to an angle spread of output light forming an optical image. In this case, a magnitude of at least one third in-plane wavenumber vector of third in-plane wavenumber vectors in four directions corresponding to the above-mentioned first in-plane wavenumber vectors in the four directions obtained by adding the diffraction vector to the second in-plane wavenumber vectors in the four directions is set to be smaller than $2\pi/\lambda$. According to this aspect, a configuration in which the magnitude of at least one of the in-plane wavenumber vectors in the four directions formed in the reciprocal lattice space and each including the wavenumber spread is smaller than $2\pi/\lambda$ (light line) can be easily realized.

(4) As an aspect of the present embodiment, the phase distribution may be a phase distribution in which a first phase distribution for forming the optical image and a second phase distribution unrelated to the formation of the optical image are superimposed, and the second phase distribution may be a phase distribution for adding (vector sum) a diffraction vector having certain constant magnitude and orientation to second in-plane wavenumber vectors in four directions of the first phase distribution formed in the reciprocal lattice space of the phase modulation layer without including a wavenumber spread corresponding to an angle spread of output light forming the optical image. In this case, a magnitude of at least one third in-plane wavenumber vector of third in-plane wavenumber vectors in four directions corresponding to the first in-plane wavenumber vectors in the four directions which are obtained by adding the diffraction vector to the second in-plane wavenumber vectors in the four directions is set to be smaller than a value obtained by subtracting the wavenumber spread corresponding to the angle spread of the output light forming the optical image from $2\pi/\lambda$. According to this aspect, a configuration in which the magnitude of at least one of the in-plane wavenumber vectors formed in the reciprocal lattice space and not including the wavenumber spread in the four directions is smaller than $2\pi/\lambda$ (light line) can be easily realized.

(5) As an aspect of the present embodiment, the second phase distribution may be a distribution (distribution in which the phase values are arranged in a check pattern) in which first phase values and second phase values different from the first phase values are alternately arranged along two directions orthogonal to each other. With such a phase distribution, the above-mentioned diffraction vector can be easily realized. As an aspect of the present embodiment, the second phase distribution may be a distribution in which the first phase value and the second phase value different from the first phase value change by $\pi$.

As described above, each of the aspects listed in the [Description of Embodiment of Present Disclosure] is applicable to each of all the remaining aspects or all combinations of these remaining aspects.

Details of Embodiment of Present Disclosure

Hereinafter, a specific structure of a light emission device according to an embodiment of the present disclosure will be described in detail with reference to the accompanying drawings. Note that, the present disclosure is not limited to these examples, but is defined by the scope of the claims. The present disclosure is intended to include meanings equivalent to the scope of the claims and all modification examples within the scope. Further, in a description of the drawings, the same components are denoted by the same reference signs, and a redundant description will be omitted.

Figure 2:
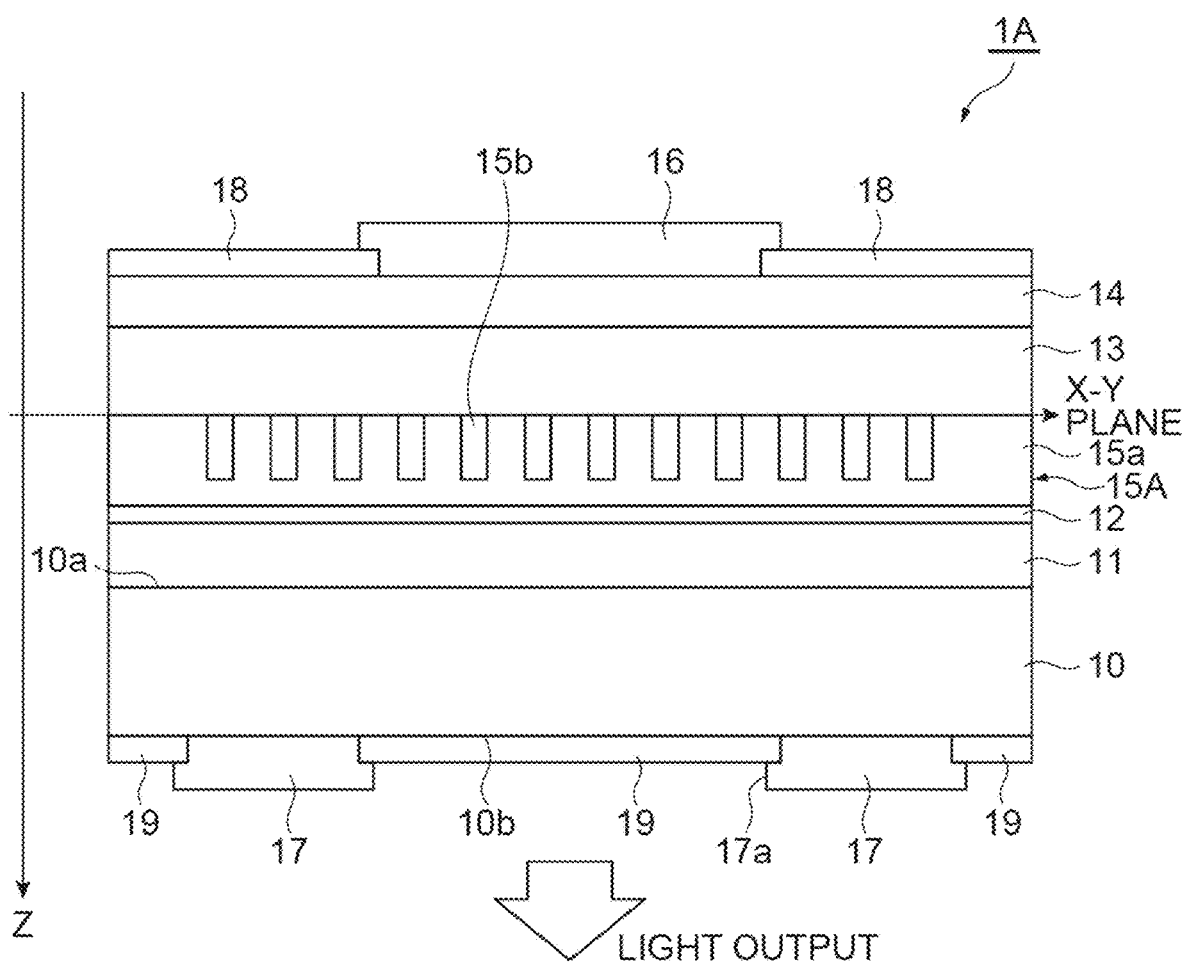
FIG. 2 is a cross-sectional view illustrating a laminated structure of the semiconductor light emission element 1A.

FIG. 1 is a perspective view illustrating a configuration of a semiconductor light emission element 1A as a light emission device according to the embodiment of the present disclosure. FIG. 2 is a cross-sectional view illustrating a laminated structure of the semiconductor light emission element 1A. An XYZ Cartesian coordinate system having, as a Z-axis, an axis that passes through a center of the semiconductor light emission element 1A and extends in a thickness direction of the semiconductor light emission element 1A is defined. The semiconductor light emission element 1A is an S-iPM laser that forms a standing wave in an XY in-plane direction and outputs a plane wave whose phase is controlled in a Z-axis direction, and outputs light forming an optical image having any two-dimensional shape along a normal direction of a main surface 10a of a semiconductor substrate 10 (that is, the Z-axis direction), an inclination direction intersecting the normal direction, or both the normal direction and the inclination direction as will be described later.

As illustrated in FIGS. 1 and 2, the semiconductor light emission element 1A includes an active layer 12 as a light emission portion provided above the semiconductor substrate 10, a pair of cladding layers 11 and 13 sandwiching the active layer 12, and a contact layer 14 provided on the cladding layer 13. The semiconductor substrate 10 and the layers 11 to 14 are comprised of a compound semiconductor such as a GaAs-based semiconductor, an InP-based semiconductor, or a nitride-based semiconductor. Energy band gaps of the cladding layer 11 and the cladding layer 13 are larger than an energy band gap of the active layer 12. Thickness directions of the semiconductor substrate 10 and the layers 11 to 14 coincide with the Z-axis direction.

The semiconductor light emission element 1A further includes a phase modulation layer 15A optically coupled to the active layer 12. In the present embodiment, the phase modulation layer 15A is provided between the active layer 12 and the cladding layer 13. If necessary, an optical guide layer may be provided at least between the active layer 12 and the cladding layer 13 or between the active layer 12 and the cladding layer 11. A thickness direction of the phase modulation layer 15A coincides with the Z-axis direction. The optical guide layer may include a carrier barrier layer for efficiently confining carriers in the active layer 12.

Figure 3:
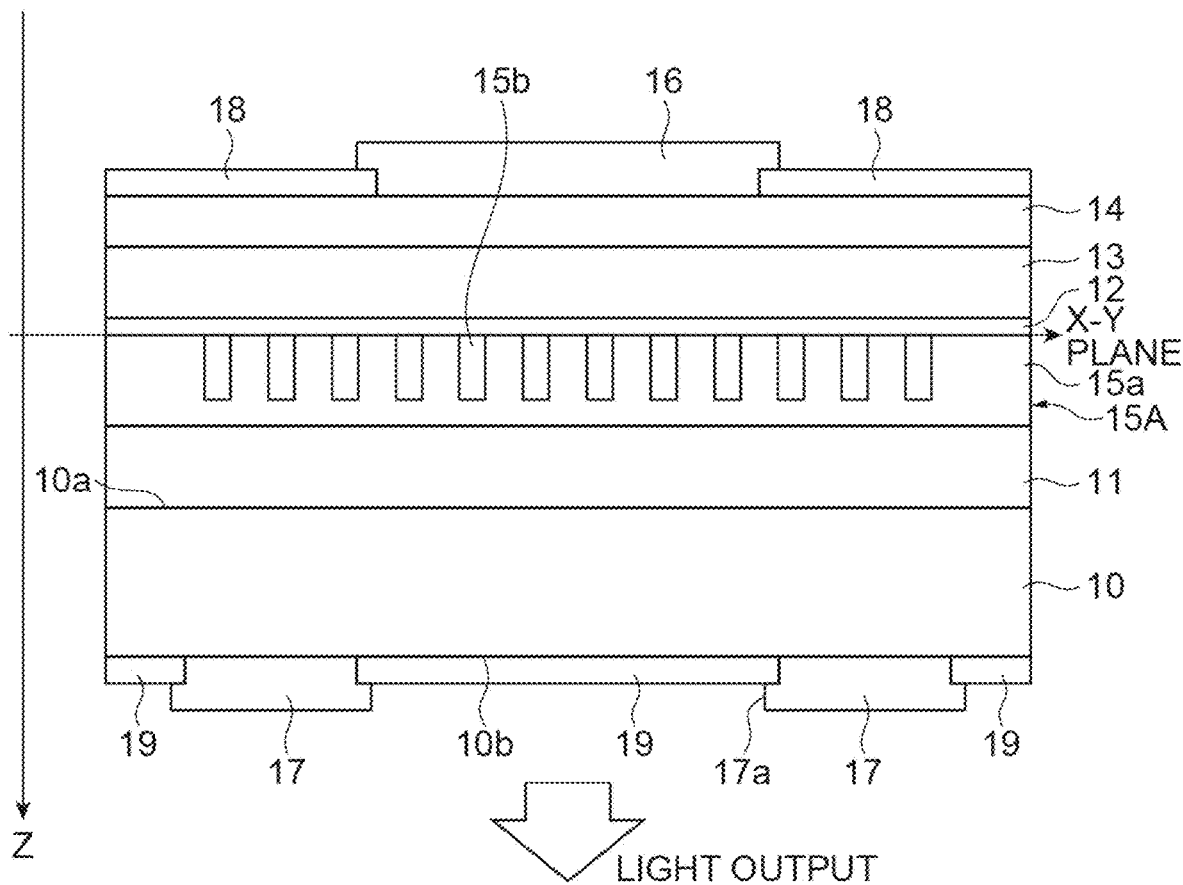
FIG. 3 is a cross-sectional view illustrating the laminated structure of the semiconductor light emission element 1A.

As illustrated in FIG. 3, the phase modulation layer 15A may be provided between the cladding layer 11 and the active layer 12.

The phase modulation layer 15A includes a base layer 15a and a plurality of modified refractive index regions 15b. The base layer 15a is comprised of a first refractive index medium. Each modified refractive index region 15b is comprised of a second refractive index medium having a refractive index different from that of the first refractive index medium, and is present in the base layer 15a. Two-dimensional arrangement of the plurality of modified refractive index regions 15b includes a substantially periodic structure. When an equivalent refractive index of a mode is n, a wavelength $\lambda_0$ ($=(\sqrt{2})a \times n$, a is a lattice spacing) selected by the phase modulation layer 15A is included in an emission wavelength range of the active layer 12. The phase modulation layer 15A can selectively output light having a band edge wavelength near the wavelength $\lambda_0$ of the emission wavelength of the active layer 12 to the outside. A laser beam incident in the phase modulation layer 15A forms a predetermined mode corresponding to the arrangement of the modified refractive index regions 15b in the phase modulation layer 15A, and is emitted as a laser beam having a desired pattern from a front surface of the semiconductor light emission element 1A to the outside.

The semiconductor light emission element 1A further includes an electrode 16 provided on the contact layer 14 and an electrode 17 provided on a back surface 10b of the semiconductor substrate 10. The electrode 16 is in ohmic contact with the contact layer 14. The electrode 17 is in ohmic contact with the semiconductor substrate 10. The electrode 17 has an opening 17a. The electrode 16 is provided in a central region of the contact layer 14. A portion of the contact layer 14 other than the electrode 16 is covered with a protective film 18 (see FIG. 2). The contact layer 14 that is not in contact with the electrode 16 may be removed. A portion of the back surface 10b of the semiconductor substrate 10 other than the electrode 17 (including the inside of the opening 17a) is covered with an antireflection film 19. The antireflection film 19 in a region other than the opening 17a may be removed.

When a drive current is supplied between the electrode 16 and the electrode 17, electrons and holes are recombined in the active layer 12, and light is emitted into the active layer 12. The electrons and holes that contribute to light emission in the active layer 12 and the generated light are efficiently confined between the cladding layer 11 and the cladding layer 13.

The light outputted from the active layer 12 enters an inside of the phase modulation layer 15A and forms a predetermined mode corresponding to a lattice structure of the inside of the phase modulation layer 15A. The laser beam outputted from the phase modulation layer 15A is directly outputted from the back surface 10b to the outside of the semiconductor light emission element 1A through the opening 17a, or is reflected by the electrode 16 and then outputted from the back surface 10b to the outside of the semiconductor light emission element 1A through the opening 17a. At this time, signal light included in the laser beam is output along the normal direction of the main surface 10a, the inclination direction intersecting the normal direction, or both of these directions. Light forming a desired optical image, out of output light, is the signal light. The signal light is mainly +1-order light and −1-order light. As will be described later, the zero-order is not outputted from the phase modulation layer 15A of the present embodiment.

In one example, the semiconductor substrate 10 is a GaAs substrate, and the cladding layer 11, the active layer 12, the cladding layer 13, the contact layer 14, and the phase modulation layer 15A are compound semiconductor layers comprised of a group III element and a group V element. Specifically, the cladding layer 11 is an AlGaAs layer. The active layer 12 has a multiple quantum well structure (barrier layer: AlGaAs/well layer: InGaAs). In the phase modulation layer 15A, the base layer 15a is GaAs, and the modified refractive index region 15b is an empty hole. The cladding layer 13 is an AlGaAs layer. The contact layer 14 is a GaAs layer.

In the above-described configuration, a thickness of the semiconductor substrate 10 is 50 μm to 300 μm, and is 150 μm in one example. The semiconductor substrate may be thicker than the above-described range as long as the elements can be separated. By contrary, in a structure having a separate support substrate, the semiconductor substrate may not be provided. A thickness of the cladding layer 11 is 500 nm to 10000 nm, and is 2000 nm in one example. A thickness of the active layer 12 is 100 nm to 300 nm, for example, 175 nm. A thickness of the phase modulation layer 15A is 100 nm to 500 nm, for example, 280 nm. A thickness of the cladding layer 13 is 500 nm to 10000 nm, and is 2000 nm in one example. A thickness of the contact layer 14 is 50 nm to 500 nm, and is 150 nm in one example.

In AlGaAs, the energy band gap and the refractive index can be easily changed by changing a composition ratio of Al. In $Al_xGa_{1-x}As$, when a composition ratio x of Al having a relatively small atomic radius is decreased (increased), the energy band gap positively correlated with the Al composition ratio becomes small (large). In the case of InGaAs in which In having a large atomic radius is mixed with GaAs, the energy band gap becomes small. That is, the Al composition ratio in the cladding layers 11 and 13 is larger than the Al composition ratio of the barrier layer (AlGaAs) in the active layer 12. The Al composition ratio in the cladding layers 11 and 13 is set to, for example, 0.2 to 1.0, and is 0.4 in one example. The Al composition ratio of the barrier layer in the active layer 12 is set to, for example, 0 to 0.3, and is 0.15 in one example.

In another example, the semiconductor substrate 10 is an InP substrate. The cladding layer 11, the active layer 12, the phase modulation layer 15A, the cladding layer 13, and the contact layer 14 are comprised of, for example, an InP-based compound semiconductor. Specifically, the cladding layer 11 is an InP layer. The active layer 12 has a multiple quantum well structure (barrier layer: GaInAsP/well layer: GaInAsP). In the phase modulation layer 15A, the base layer 15a is GaInAsP or InP, and the modified refractive index region 15b is an empty hole. The cladding layer 13 is an InP layer. The contact layer 14 is GaInAsP, GaInAs, or InP.

In yet another example, the semiconductor substrate 10 is an InP substrate. The cladding layer 11, the active layer 12, the phase modulation layer 15A, the cladding layer 13, and the contact layer 14 are comprised of, for example, an InP-based compound semiconductor. Specifically, the cladding layer 11 is an InP layer. The active layer 12 has a multiple quantum well structure (barrier layer: AlGaInAs/well layer: AlGaInAs). In the phase modulation layer 15A, the base layer 15a is AlGaInAs or InP, and the modified refractive index region 15b is an empty hole. The cladding layer 13 is an InP layer. The contact layer 14 is a GaInAs or an InP layer. These materials and the materials using GaInAsP and InP described in the "another example" can be applied to an optical communication wavelength in 1.3 and 1.55 μm bands, and light having an eye-safe wavelength longer than 1.4 μm can be outputted.

In yet another example, the semiconductor substrate 10 is a GaN substrate. The cladding layer 11, the active layer 12, the phase modulation layer 15A, the cladding layer 13, and the contact layer 14 are comprised of, for example, a nitride-based compound semiconductor. Specifically, the cladding layer 11 is an AlGaN layer. The active layer 12 has a multiple quantum well structure (barrier layer: InGaN/well layer: InGaN). In the phase modulation layer 15A, the base layer 15a is GaN, and the modified refractive index region 15b is an empty hole. The cladding layer 13 is an AlGaN layer, and the contact layer 14 is a GaN layer.

The same conductive type as the semiconductor substrate 10 is used as the cladding layer 11. A conductive type opposite to that of the semiconductor substrate 10 is used as the cladding layer 13 and the contact layer 14. In one example, the semiconductor substrate 10 and the cladding layer 11 are n-type, and the cladding layer 13 and the contact layer 14 are p-type. The phase modulation layer 15A has the same conductive type as the semiconductor substrate 10 when the phase modulation layer 15A is provided between the active layer 12 and the cladding layer 11, and has the conductive type opposite to that of the semiconductor substrate 10 when the phase modulation layer 15A is provided between the active layer 12 and the cladding layer 13. An impurity concentration is, for example, $1 \times 10^{16}$ to $1 \times 10^{21}$/cm$^3$. The active layer 12 is intrinsic (i-type) in which impurities are not intentionally added, and the impurity concentration is $1 \times 10^{16}$/cm$^3$ or less. The impurity concentration of the phase modulation layer 15A may be intrinsic (i-type) when it is necessary to suppress influence of a loss due to light absorption via an impurity level.

Although the modified refractive index region 15b is the empty hole in the above-described example, the modified refractive index region 15b may be formed by embedding a semiconductor having a refractive index different from the refractive index of the base layer 15a in an empty hole. In this case, for example, after an empty hole of the base layer 15a is formed by etching, the above-described semiconductor may be embedded in the empty hole by using a metalorganic vapor phase growth method, a sputtering method, or an epitaxial method. For example, when the base layer 15a is comprised of GaAs, the modified refractive index region 15b may be comprised of AlGaAs. After the modified refractive index region 15b is formed by embedding the semiconductor in the empty hole of the base layer 15a, the same semiconductor as the modified refractive index region 15b may be further deposited on the modified refractive index region 15b. When the modified refractive index region 15b is an empty hole, an inert gas such as argon or nitrogen or a gas such as hydrogen or air may be sealed in the empty hole.

The antireflection film 19 is comprised of, for example, a dielectric single layer film such as silicon nitride (for example, SiN) or a silicon oxide (for example, $SiO_2$), or a dielectric multilayer film. A film in which two or more types of dielectric layers selected from a dielectric layer group such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), a titanium oxide ($TiO_2$), aluminum oxide ($Al_2O_3$), cerium oxide ($CeO_2$), indium oxide ($In_2O_3$), and zirconium oxide ($ZrO_2$) are laminated can be applied as the dielectric multilayer film. For example, a film thickness is an optical film thickness with respect to light having a wavelength of $\lambda$, and is about $\lambda/4$. The protective film 18 is, for example, an insulating film such as silicon nitride (for example, SiN) or silicon oxide (for example, $SiO_2$). When the semiconductor substrate 10 and the contact layer 14 are comprised of a GaAs-based semiconductor, the electrode 16 can be comprised of a material containing Au and at least one of Cr, Ti, and Pt, and has, for example, a laminated structure of a Cr layer and an Au layer. The electrode 17 can be comprised of a material containing Au and at least one of AuGe and Ni, and has, for example, a laminated structure of an AuGe layer and an Au layer. The materials of the electrodes 16 and 17 are not limited to the listed materials as long as ohmic junction can be realized.

An electrode shape is deformed, and thus, the laser beam can be outputted from the front surface of the contact layer 14. That is, when the opening 17a of the electrode 17 is not provided and the electrode 16 is opened on the front surface of the contact layer 14, the laser beam is outputted from the front surface of the contact layer 14 to the outside. In this case, the antireflection film is provided inside and around an opening of the electrode 16.

Figure 4:
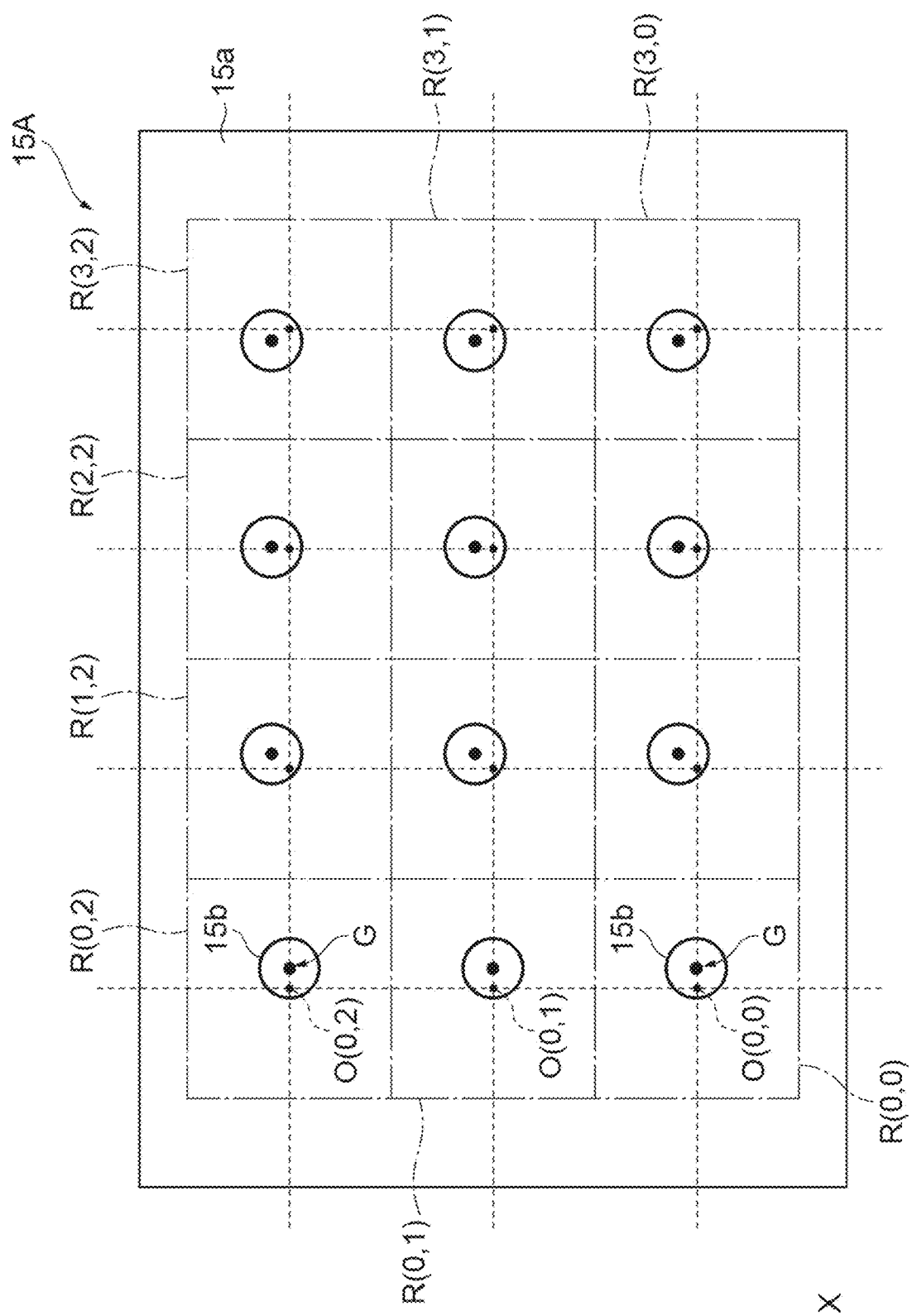
FIG. 4 is a plan view of a phase modulation layer 15A.

FIG. 4 is a plan view of the phase modulation layer 15A. The phase modulation layer 15A includes a base layer 15a and a plurality of modified refractive index regions 15b. The base layer 15a is comprised of a first refractive index medium. The plurality of modified refractive index regions 15b is comprised of a second refractive index medium having a refractive index different from that of the first refractive index medium. Here, a virtual square lattice is set on one surface of the phase modulation layer 15A that coincides with an X-Y plane. One side of the square lattice is parallel to an X-axis and the other side is parallel to a Y-axis. At this time, square-shaped unit constituent regions R(x, y) having lattice points O of the square lattice as centers may be set in a two-dimension shape over a plurality of columns (x=0, 1, 2, 3, . . . ) along the X-axis and a plurality of rows (y=0, 1, 2, . . . ) along the Y-axis. When it is assumed that XY coordinates of each unit constituent region R are given at a position of center of gravity of each unit constituent region R, this position of center of gravity coincides with the lattice point O of the virtual square lattice. The plurality of modified refractive index regions 15b is provided, for example, one in each unit constituent region R. A planar shape of the modified refractive index region 15b is, for example, a circular shape. The lattice point O may be positioned outside the modified refractive index region 15b or may be included in an inside of the modified refractive index region 15b.

A ratio of an area S of the modified refractive index region 15b occupying one unit constituent region R is called a filling factor (FF). When the lattice spacing of the square lattice is a, the filling factor FF of the modified refractive index region 15b is given as $S/a^2$. S is the area of the modified refractive index region 15b in the X-Y plane, and is given as $S=\pi(d/2)^2$ by using a diameter d of a perfect circle, for example, when a shape of the modified refractive index region 15b is the perfect circle. When the shape of the modified refractive index region 15b is square, the area thereof is given as $S=LA^2$ by using a length LA of one side of the square.

Figure 5:
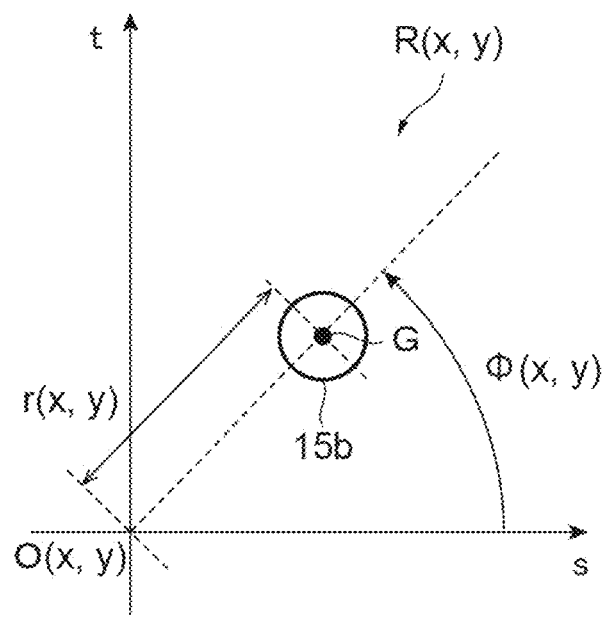
FIG. 5 is a diagram illustrating a positional relationship between modified refractive index regions 15b in a unit constituent region R of the phase modulation layer 15A.

FIG. 5 is an enlarged view illustrating a part (unit constituent region R) of the phase modulation layer 15A. As illustrated in FIG. 5, each of the modified refractive index regions 15b has a center of gravity G, and the position of the center of gravity G in the unit constituent region R is given by an s-axis and a t-axis orthogonal to the lattice point O. Here, it is assumed that an angle formed by a vector from the lattice point O(x, y) toward the center of gravity G and the s-axis is $\varphi(x, y)$ in the unit constituent region R(x, y) defined by the s-axis and the t-axis orthogonal to each other. x indicates a position of an x-th lattice point along the X-axis, and y indicates a position of a y-th lattice point along the Y-axis. When a rotation angle $\varphi$ is 0°, an orientation of the vector connecting the lattice point O(x, y) and the center of gravity G coincides with a positive direction of the X-axis. It is assumed that a length of the vector connecting the lattice point O(x, y) and the center of gravity G is r(x, y). In one example, r(x, y) is constant (over the entire phase modulation layer 15A) regardless of x and y.

As illustrated in FIG. 4, the orientation of the vector connecting the lattice point O(x, y) and the center of gravity G (the center of gravity of the corresponding modified refractive index region 15b), that is, the rotation angle $\varphi$ around the lattice point of the center of gravity G of the modified refractive index region 15b corresponds to a desired optical image and is individually set for each lattice point O(x, y) according to a phase pattern. The phase pattern, that is, a rotation angle distribution $\varphi(x, y)$ has a specific value for each position decided by the values of x and y, but may not be represented by a specific function. That is, the rotation angle distribution $\varphi(x, y)$ is decided from a phase distribution extracted from among complex amplitude distributions obtained by performing inverse Fourier transform on the desired optical image. When the complex amplitude distributions are obtained from the desired optical image, reproducibility of the beam pattern can be improved by applying an iterative algorithm such as a Gerchberg-Saxton (GS) method that is commonly used in calculating a hologram.

Figure 6:
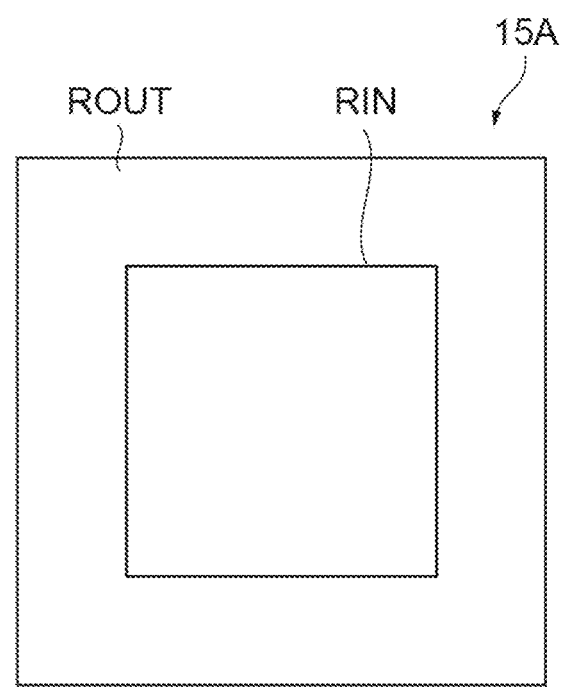
FIG. 6 is a plan view illustrating an example in which a substantially periodic structure of a refractive index of FIG. 4 is applied only within a specific region of the phase modulation layer.

FIG. 6 is a plan view illustrating an example in which the substantially periodic structure of the refractive index of FIG. 4 is applied only within a specific region of the phase modulation layer. In the example illustrated in FIG. 6, the substantially periodic structure (example: the structure of FIG. 4) for outputting a target beam pattern is formed in an inside of an inner region RIN of the square. On the other hand, in an outer region ROUT that surrounds the inner region RIN, a perfect circular modified refractive index region whose position of center of gravity coincides with a position of the lattice point of the square lattice is arranged. For example, the filling factor FF in the outer region ROUT is set to 12%. The lattice spacing of the virtually set square lattice is the same (=a) on both an inside of the inner region RIN and an inside of the outer region ROUT. In the case of this structure, there is an advantage that the generation of high-frequency noise (so-called window function noise) caused by an abrupt change in light intensity in a peripheral portion of the inner region RIN by distributing light in the outer region ROUT can be suppressed. Light leakage in the in-plane direction can be suppressed, and reduction in threshold current can be expected.

Figure 7:
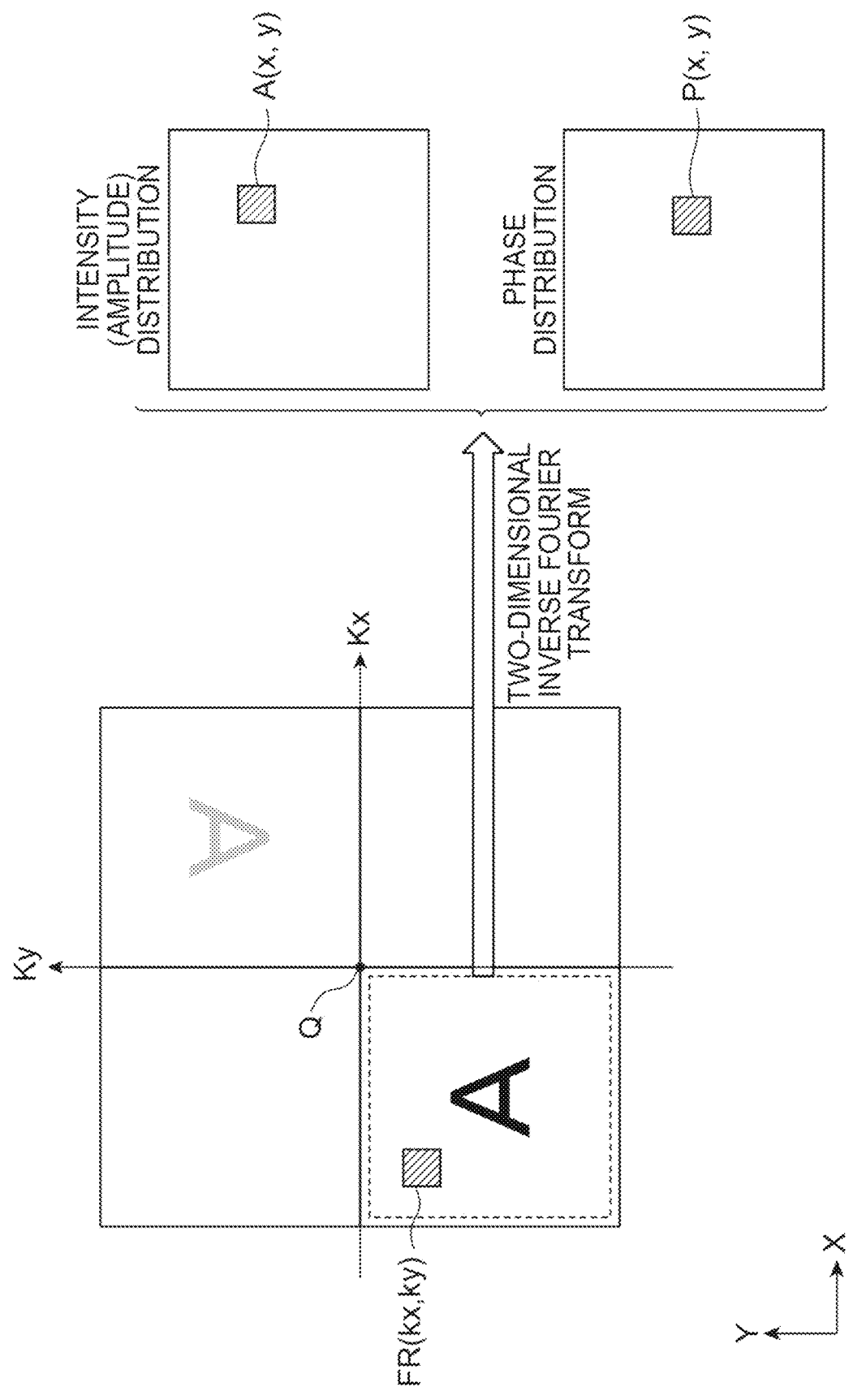
FIG. 7 is a diagram for describing a relationship between an optical image obtained by imaging an output beam pattern of the semiconductor light emission element 1A and a rotation angle distribution φ(x, y) in the phase modulation layer 15A.

FIG. 7 is a diagram for describing a relationship between an optical image which is an output beam pattern of the semiconductor light emission element 1A and the rotation angle distribution φ(x, y) in the phase modulation layer 15A. A center Q of the output beam pattern may not be positioned on an axis perpendicular to the main surface 10a of the semiconductor substrate 10, but may also be arranged on the perpendicular axis. Here, it is assumed that a center Q of a wavenumber space given by a Kx-axis and a Ky-axis orthogonal to each other is positioned on the axis perpendicular to the main surface 10a for the sake of convenience in description. FIG. 7 illustrates four quadrants with the center Q as an origin. FIG. 7 illustrates a case where optical images are obtained in a first quadrant and a third quadrant as an example, but images can be obtained in a second quadrant and a fourth quadrant or all quadrants. In the present embodiment, optical images point-symmetric with respect to the origin are obtained as illustrated in FIG. 7. As an example, FIG. 7 illustrates a case where a character "A" is obtained in the third quadrant and a pattern obtained by rotating the character "A" by 180 degrees is obtained in the first quadrant. In the case of rotational symmetrical optical images (for example, a cross, a circle, a double circle, and the like), these optical images are observed as one superimposed optical image.

The optical image of the output beam pattern of the semiconductor light emission element 1A includes at least one of a spot, a straight line, a cross, a line drawing, a lattice pattern, a photograph, a striped pattern, computer graphics (CG), and a character. Here, in order to obtain a desired optical image, the rotation angle distribution φ(x, y) of the modified refractive index region 15b of the phase modulation layer 15A is decided by the following procedure.

In the present embodiment, the desired optical image can be obtained by deciding the rotation angle distribution φ(x, y) by the following procedure. First, in a first precondition, a virtual square lattice formed by M1 (integer of 1 or more)×N1 (integer of 1 or more) unit constituent regions R each having a square shape is set on the X-Y plane in the XYZ Cartesian coordinate system defined by the Z-axis coinciding with the normal direction and the X-Y plane that coincides with one surface of the phase modulation layer 15A including the plurality of modified refractive index regions 15b and includes the X-axis and the Y-axis orthogonal to each other.

Figure 8:
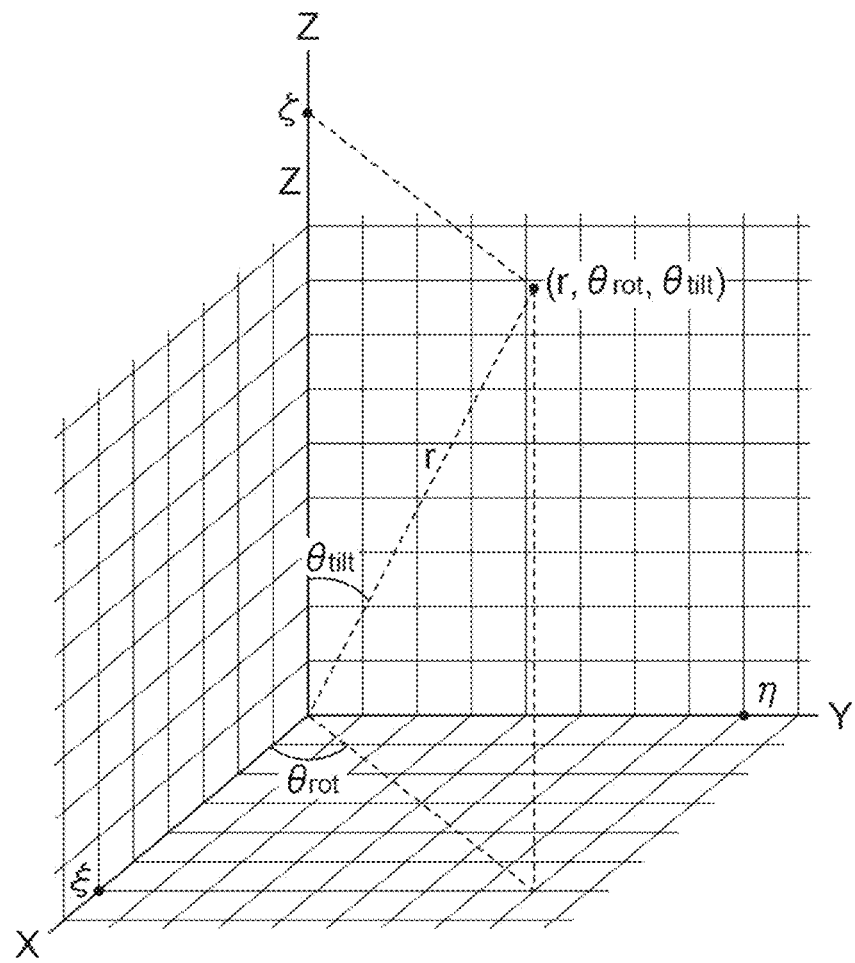
FIG. 8 is a diagram for describing coordinate conversion from spherical coordinates (r, $\theta_{tilt}$, $\theta_{rot}$) into coordinates (ξ, η, ζ) in an XYZ Cartesian coordinate system.

In a second precondition, it is assumed that coordinates (ξ, η, ζ) in the XYZ Cartesian coordinate system satisfy a relationship represented by the following Formula (1) to Formula (3) with respect to spherical coordinates (r, θ$_{rot}$, θ$_{tilt}$) defined by a length r of a radial diameter, an inclination angle θ$_{tilt}$ from the Z-axis, and a rotation angle θ$_{rot}$ from the X-axis specified on the X-Y plane as illustrated in FIG. 8. FIG. 8 is a diagram for describing coordinate conversion from the spherical coordinates (r, θ$_{rot}$, θ$_{tilt}$) to the coordinates (ξ, η, ζ) in the XYZ Cartesian coordinate system, and an optical image in design on a predetermined plane set in the XYZ Cartesian coordinate system which is a real space is expressed by the coordinates (ξ, η, ζ). When the beam pattern corresponding to the optical image outputted from the semiconductor light emission element is a set of bright spots heading in a direction defined by the angles θ$_{tilt}$ and θ$_{rot}$, the angles θ$_{tilt}$ and θ$_{rot}$ are converted into a coordinate value $k_x$ on the Kx-axis which is a normalized wavenumber defined by the following Formula (4) and corresponds to the X-axis and a coordinate value $k_y$ on the Ky-axis which is a normalized wavenumber defined by the following Formula (5), corresponds to the Y-axis, and is orthogonal to the Kx-axis. The normalized wavenumber means the wavenumber normalized with a wavenumber 2π/a corresponding to the lattice spacing of the virtual square lattice as 1.0. At this time, in the wavenumber space defined by the Kx-axis and the Ky-axis, a specific wavenumber range including the beam pattern corresponding to the optical image is constituted by M2 (integer of 1 or more)×N2 (integer of 1 or more) image regions FR. The integer M2 need not coincide with the integer M1. Similarly, the integer N2 need not coincide with the integer N1. Formula (4) and Formula (5) are disclosed in, for example, Non-Patent Document 2 described above.

$$\xi = r \sin \theta_{tilt} \cos \theta_{rot} \qquad (1)$$

$$\eta = r \sin \theta_{tilt} \sin \theta_{rot} \qquad (2)$$

$$\zeta = r \cos \theta_{tilt} \qquad (3)$$

$$k_x = \frac{a}{\lambda} \sin\theta_{tilt}\cos\theta_{rot} \qquad (4)$$

$$k_y = \frac{a}{\lambda} \sin\theta_{tilt}\sin\theta_{rot} \qquad (5)$$

a: lattice constant of virtual square lattice
λ: oscillation wavelength

In a third precondition, in the wavenumber space, a complex amplitude F(x, y) obtained by performing two-dimensional inverse discrete Fourier transform from each image region FR($k_x$, $k_y$) specified by a coordinate component $k_x$ (integer of 0 or more and M2-1 or less) in the Kx-axis direction and a coordinate component $k_y$ (integer of 0 or more and N2-1 or less) in the Ky-axis direction into the unit constituent region R(x, y) on the X-Y plane specified by a coordinate component x (integer of 0 or more and M1-1 or less) in the X-axis direction and a coordinate component y (integer of 0 or more and N1-1 or less) in the Y-axis direction is given in the following Formula (6) with j as an imaginary unit. When an amplitude term is A(x, y) and a phase term is P(x, y), the complex amplitude F(x, y) is defined by the following Formula (7). In a fourth precondition, the unit constituent region R(x, y) is defined by the s-axis and the t-axis which are parallel to the X-axis and the Y-axis and are orthogonal at the lattice point O(x, y) as the center of the unit constituent region R(x, y).

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad (6)$$

$$F(x,y) = A(x,y) \times \exp[jP(x,y)] \quad (7)$$

Under the above-described first to fourth preconditions, the phase modulation layer 15A is formed to satisfy the following first and second conditions. That is, the first condition is that the center of gravity G is arranged in the unit constituent region R(x, y) in a state of being separated from the lattice point O(x, y). In the second condition, the corresponding modified refractive index region 15b is arranged in the unit constituent region R(x, y) such that an angle φ(x, y) formed by a line segment connecting the lattice point O(x, y) and the corresponding center of gravity G and the s-axis satisfies a relationship of the following formula in a state in which a line segment length r₂(x, y) from the lattice point O(x, y) to the corresponding center of gravity G is set to a common value in the M1×N1 unit constituent regions R.

φ(x,y)=C×P(x,y)+B

C: proportional constant, for example, 180°/π
B: arbitrary constant, for example, 0

As a method of obtaining an intensity (amplitude) distribution and a phase distribution from the complex amplitude distributions obtained by the inverse Fourier transform, for example, an intensity distribution I(x, y) can be calculated by using an abs function of numerical analysis software "MATLAB" of MathWorks, and a phase distribution P(x, y) can be calculated by using an angle function of MATLAB.

Figure 9A:
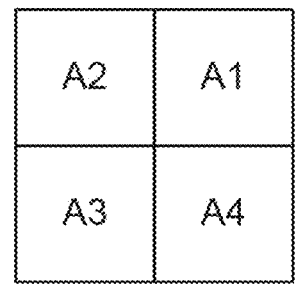
FIGS. 9A and 9B are diagrams for describing points to be noticed when calculation is performed by using a general discrete Fourier transform (or fast Fourier transform) in deciding arrangement of the modified refractive index regions 15b.
Figure 9B:
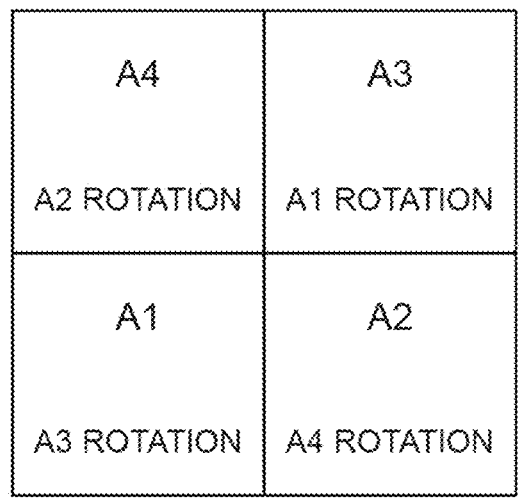

Here, when the arrangement of each modified refractive index region 15b is decided by obtaining the rotation angle distribution φ(x, y) from the result of the inverse Fourier transform of the optical image, points to be noted in the case of calculation using a general discrete Fourier transform (or fast Fourier transform) are described below. When the optical image before the inverse Fourier transform is divided into four quadrants such as A1, A2, A3, and A4 as illustrated in FIG. 9A, the obtained beam pattern is as illustrated in FIG. 9B. That is, a pattern obtained by superimposing a pattern obtained by rotating the first quadrant of FIG. 9A by 180 degrees on a pattern of the third quadrant of FIG. 9A appears in the first quadrant of the beam pattern illustrated in FIG. 9B. A pattern obtained by superimposing a pattern obtained by rotating a pattern of the second quadrant of FIG. 9A by 180 degrees on a pattern of the fourth quadrant of FIG. 9A appears in the second quadrant of the beam pattern illustrated in FIG. 9B. A pattern obtained by superimposing a pattern obtained by rotating a pattern of the third quadrant of FIG. 9A by 180 degrees on a pattern of the first quadrant of FIG. 9A appears in the third quadrant of the beam pattern illustrated in FIG. 9B. A pattern obtained by superimposing a pattern obtained by rotating a pattern of the fourth quadrant of FIG. 9A by 180 degrees on a pattern of the second quadrant of FIG. 9A appears in the fourth quadrant of the beam pattern illustrated in FIG. 9B.

Accordingly, when an optical image having a value only in the first quadrant is used as the optical image (original optical image) before the inverse Fourier transformation, the pattern of the first quadrant of the original optical image appears in the third quadrant of the obtained beam pattern, and a pattern obtained by rotating the pattern of the first quadrant of the original optical image by 180 degrees appears in the first quadrant of the obtained beam pattern.

As described above, in the semiconductor light emission element 1A, phase modulation is performed on, and thus, a wave surface a desired beam pattern is obtained. This beam pattern may be not only a pair of unimodal beams (spots) but also a character shape, a group of two or more spots having the same shape, or a vector beam in which the phase and intensity distributions are spatially non-uniform as described above.

It is preferable that the refractive index of the base layer 15a is 3.0 to 3.5 and the refractive index of each modified refractive index region 15b is 1.0 to 3.4. An average radius of each modified refractive index region 15b in the hole of the base layer 15a is, for example, 20 nm to 90 nm in the case of a 940 nm band. A size of each modified refractive index region 15b changes, and thus, diffraction intensity changes. This diffraction efficiency is proportional to an optical coupling coefficient represented by a coefficient when Fourier transform is performed on the shape of the modified refractive index region 15b. The optical coupling coefficient is described in, for example, Non-Patent Document 3 described above.

Next, features of the phase modulation layer 15A of the present embodiment will be described in detail. In the present embodiment, a lattice spacing a of the virtual square lattice and an emission wavelength λ of the active layer 12 satisfy a condition of M-point oscillation. When a reciprocal lattice space (wavenumber space) is considered in the phase modulation layer 15A, in-plane wavenumber vectors in four directions indicate standing waves which are phase-modulated by the rotation angle distribution φ(x, y) and each include a wavenumber spread corresponding to an angle spread of light forming the optical image are formed. The magnitude of at least one of the in-plane wavenumber vectors is smaller than 2π/λ. (light line). Hereinafter, these points will be described in detail.

First, a photonic crystal laser (PCSEL) oscillating at a Γ point in the reciprocal lattice space will be described for comparison. The PCSEL has an active layer and a photonic crystal layer in which the plurality of modified refractive index regions is periodically arranged in a two-dimension shape. In a plane perpendicular to a thickness direction of the photonic crystal layer, the PCSEL is a semiconductor element that outputs a laser beam along the normal direction of the main surface of the semiconductor substrate while forming a standing wave having an oscillation wavelength corresponding to an arrangement period of the modified refractive index region. For Γ-point oscillation, the lattice spacing a of the virtual square lattice, the emission wavelength λ of the active layer 12, and an equivalent refractive index n of the mode may satisfy a condition: λ=na.

Figure 10:
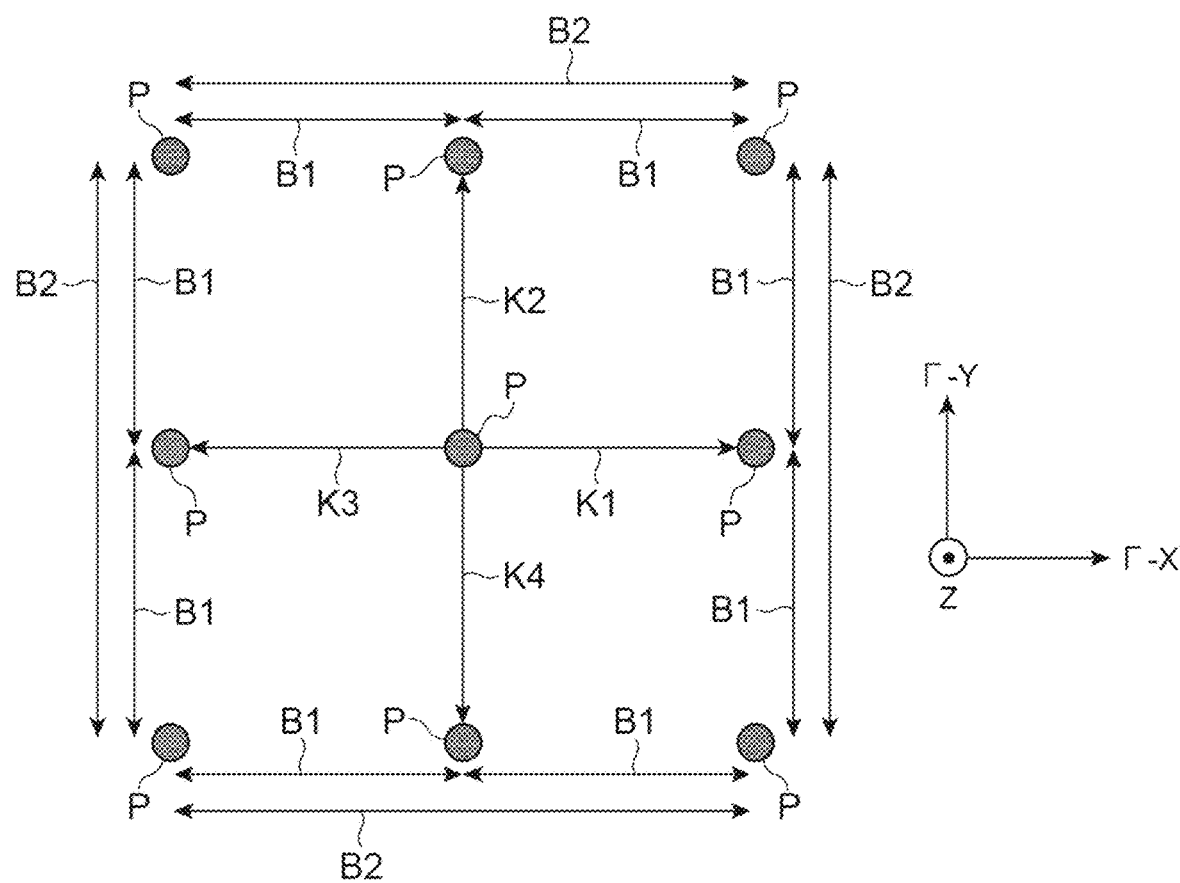
FIG. 10 is a plan view illustrating a reciprocal lattice space of a photonic crystal layer of PCSEL oscillating at a Γ point.

FIG. 10 is a plan view illustrating the reciprocal lattice space (wavenumber space) of the photonic crystal layer of the PCSEL oscillating at the Γ point. This diagram illustrates a case where the plurality of modified refractive index regions is positioned on the lattice points of the square lattice, and a point P in this drawing represents a reciprocal lattice point. An arrow B1 in this drawing represents a basic reciprocal lattice vector, and each arrow B2 represents a reciprocal lattice vector twice the basic reciprocal lattice vector B1. Arrows K1, K2, K3, and K4 represent four in-plane wavenumber vectors. The four in-plane wavenumber vectors K1, K2, K3, and K4 are combined with each other through 90° and 180° diffraction, and a standing wave state is formed. Here, a Γ-X axis and a Γ-Y axis that are orthogonal to each other are defined in the reciprocal lattice space. The Γ-X axis is parallel to one side of the square lattice, and the Γ-Y axis is parallel to the other side of the square lattice. The in-plane wavenumber vector is a vector obtained by projecting the wavenumber vector into the Γ-X and Γ-Y planes. That is, the in-plane wavenumber vector K1 faces a positive direction on the Γ-X axis, the in-plane wavenumber vector K2 faces a positive direction on the Γ-Y axis, the in-plane wavenumber vector K3 faces a negative direction on the Γ-X axis, and the in-plane wavenumber vector K4 faces a negative direction on the Γ-Y axis. As is clear from FIG. 10, in the PCSEL oscillating at the Γ point, the magnitudes of the in-plane wavenumber vectors K1 to K4 (that is, the magnitudes of the standing waves in the in-plane direction) are equal to the magnitude of the basic reciprocal lattice vector B1. Magnitudes k of the in-plane wavenumber vectors K1 to K4 are given by the following Formula (8).

$$k = |B1| = \frac{2\pi}{a} \quad (8)$$

Figure 11:
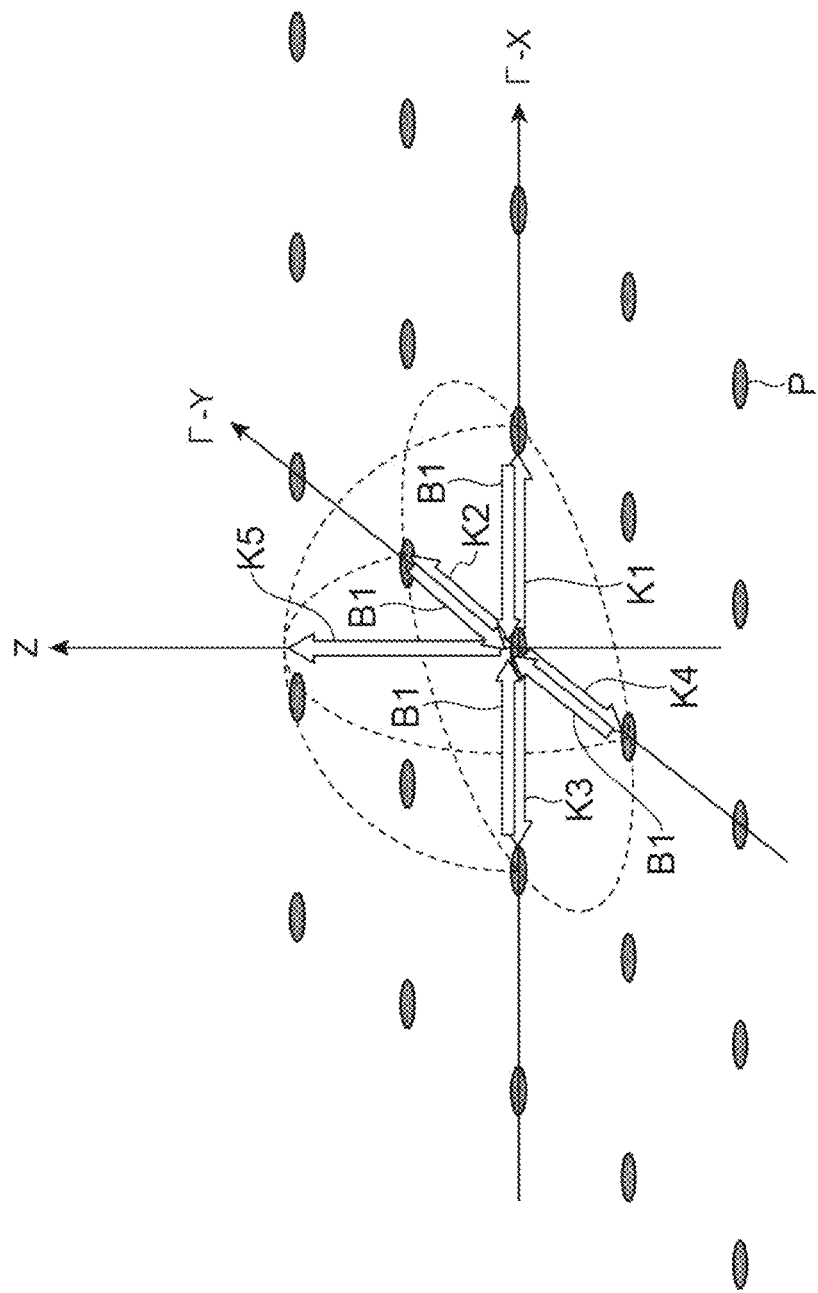
FIG. 11 is a three-dimensional perspective view of the reciprocal lattice space illustrated in FIG. 10.

FIG. 11 is a three-dimensional perspective view of the reciprocal lattice space illustrated in FIG. 10. FIG. 11 illustrates the Z-axis orthogonal to the directions of the Γ-X axis and the Γ-Y axis. This Z-axis is the same as the Z-axis illustrated in FIG. 1. As illustrated in FIG. 11, in the PCSEL oscillating at the Γ point, the wavenumber in the in-plane direction becomes 0 due to diffraction, and diffraction occurs in a plane vertical direction (Z-axis direction) (arrow K5 in this drawing). Accordingly, the laser beam is basically outputted in the Z-axis direction.

Figure 12:
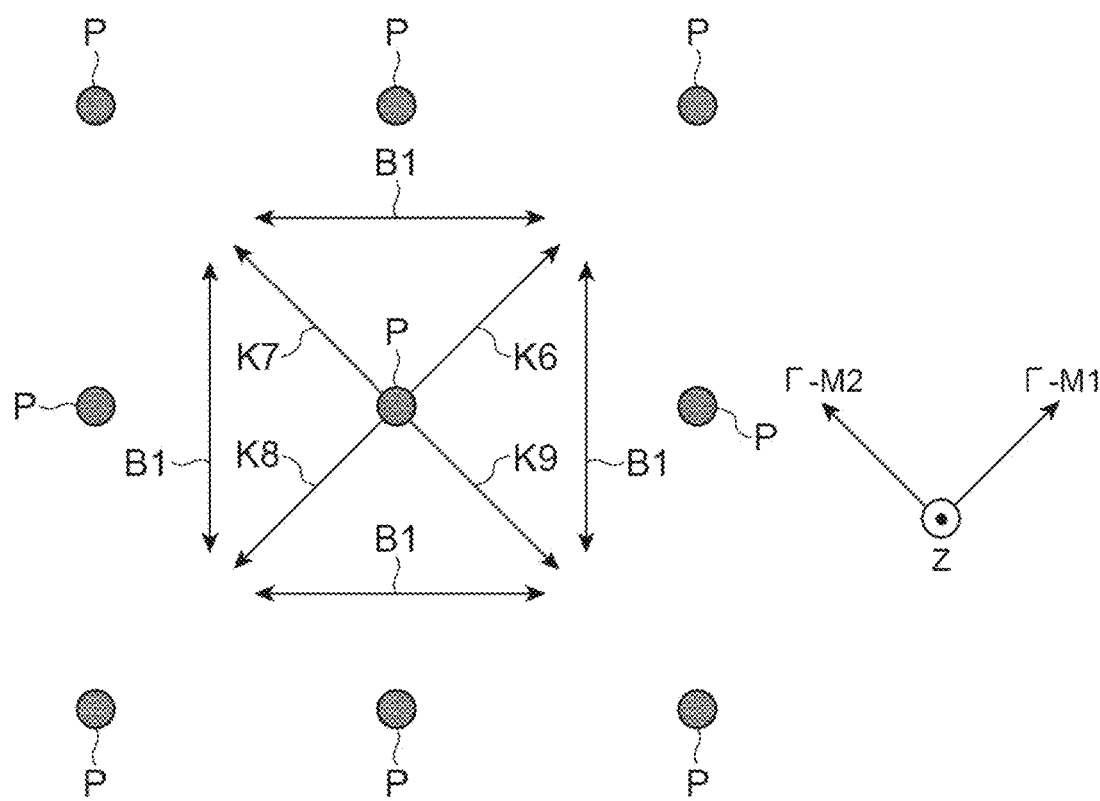
FIG. 12 is a plan view illustrating a reciprocal lattice space for a photonic crystal layer of PCSEL oscillating at a point M.

Next, PCSEL oscillating at a point M will be described. For M-point oscillation, the lattice spacing a of the virtual square lattice, the emission wavelength λ of the active layer 12, and the equivalent refractive index n of the mode may satisfy a condition: λ=(√2)n×a. FIG. 12 is a plan view illustrating the reciprocal lattice space (wavenumber space) of the photonic crystal layer of the PCSEL oscillating at the point M. FIG. 12 also illustrates a case where the plurality of modified refractive index regions is positioned on the lattice points of the square lattice, and a point P in FIG. 12 represents a reciprocal lattice point. An arrow B1 in FIG. 12 represents the same basic reciprocal lattice vector as that in FIG. 10, and arrows K6, K7, K8, and K9 represent four in-plane wavenumber vectors. Here, a Γ-M1 axis and a Γ-M2 axis that are orthogonal to each other are defined in the reciprocal lattice space. The Γ-M1 axis is parallel to one diagonal direction of the square lattice, and the Γ-M2 axis is parallel to the other diagonal direction of the square lattice. The in-plane wavenumber vector is a vector obtained by projecting the wavenumber vector into the Γ-M1 and Γ-M2 planes. That is, the in-plane wavenumber vector K6 faces a positive direction on the Γ-M1 axis, the in-plane wavenumber vector K7 faces a positive direction on the Γ-M2 axis, the in-plane wavenumber vector K8 faces a negative direction on the Γ-M1 axis, and the in-plane wavenumber vector K9 faces a negative direction on the Γ-M2 axis. As is clear from FIG. 12, in the PCSEL oscillating at the point M, the magnitudes of the in-plane wavenumber vectors K6 to K9 (that is, the magnitudes of the standing waves in the in-plane direction) are larger than the magnitude of the basic reciprocal lattice vector B1. Magnitudes k of the in-plane wavenumber vectors K6 to K9 are given by the following Formula (9).

$$k = \frac{1}{\sqrt{2}} \frac{2\pi}{a} \quad (9)$$

Diffraction occurs in a direction of a vector sum of the wavenumber vectors K6 to K9 and the reciprocal lattice vector (magnitude is 2 mπ/a, in: integer). However, in the PCSEL oscillating at the point M, the wavenumber in the in-plane direction cannot be 0 due to diffraction, and diffraction in the plane vertical direction (Z-axis direction) does not occur. Accordingly, since the laser beam is not outputted in the plane vertical direction, the M-point oscillation is not normally used in the PCSEL.

Figure 13:
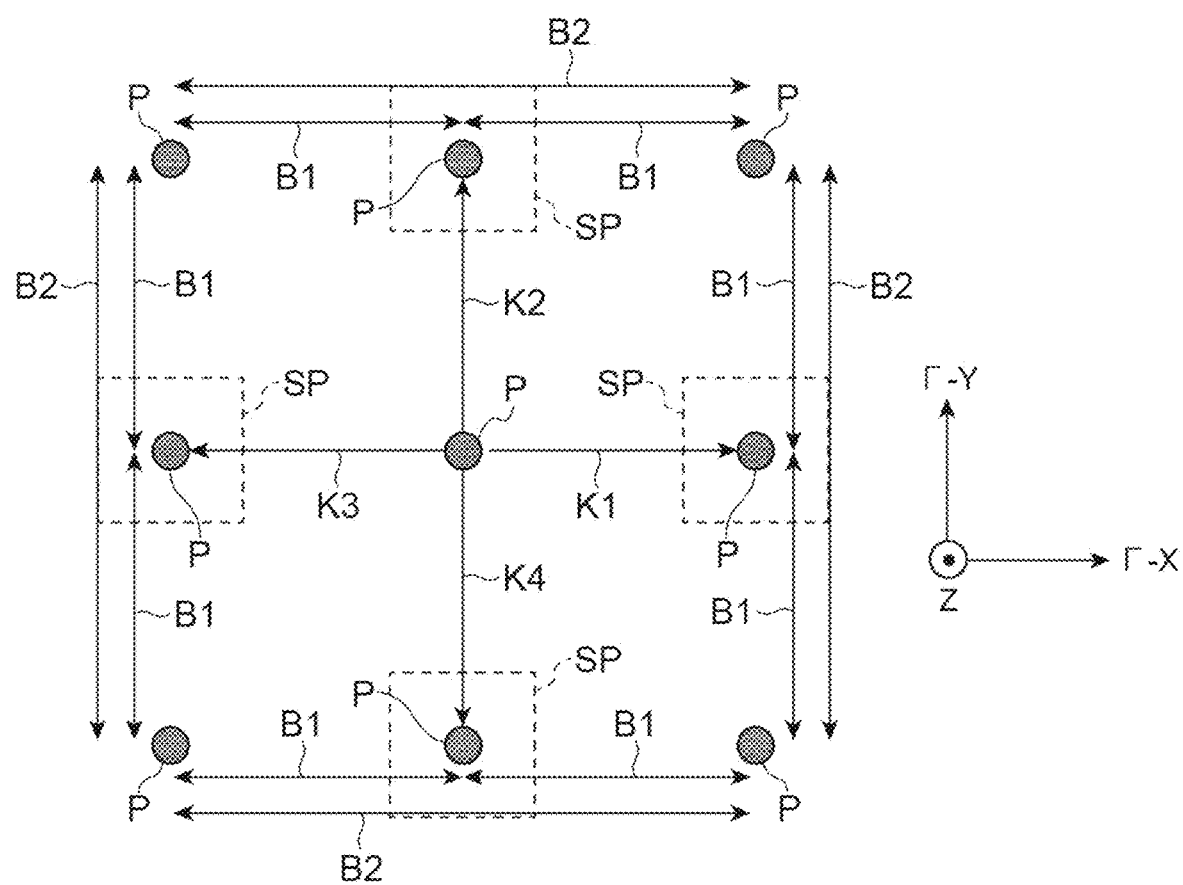
FIG. 13 is a plan view illustrating a reciprocal lattice space related to a phase modulation layer of an S-iPM laser oscillating at the F point.

Next, the S-iPM laser oscillating at the Γ point will be described. The condition of the Γ-point oscillation is the same as that in the case of the above-described PCSEL. FIG. 13 is a plan view illustrating the reciprocal lattice space for the phase modulation layer of the S-iPM laser oscillating at the Γ point. The basic reciprocal lattice vector B1 is the same as that in the PCSEL of the Γ-point oscillation (see FIG. 10), but the in-plane wavenumber vectors K1 to K4 are phase-modulated by the rotation angle distribution φ(x, y), and each have a wavenumber spread SP corresponding to the spread angle of the optical image. The wavenumber spread SP can be expressed as a rectangular region in which lengths of sides in the x-axis direction and the y-axis direction are $2\Delta kx_{max}$ and $2\Delta ky_{max}$ by using, as a center, a tip of each of the in-plane wavenumber vectors K1 to K4 in the PCSEL of the Γ-point oscillation. Due to such wavenumber spread SP, each of the in-plane wavenumber vectors K1 to K4 spreads over a rectangular range of (Kix+Δkx, Kiy+Δky) (i=1 to 4, Kix is a component of the vector Ki in the x direction, Kiy is a component of the vector Ki in the y direction). Here, $-\Delta kx_{max} \leq \Delta kx \leq \Delta kx_{max}$ and $-\Delta ky_{max} \leq \Delta ky \leq \Delta ky_{max}$. Magnitudes of $\Delta kx_{max}$ and $\Delta ky_{max}$ are decided according to the spread angle of the optical image. In other words, the magnitudes of $\Delta kx_{max}$ and $\Delta ky_{max}$ depend on the optical image to be displayed on the semiconductor light emission element 1A.

Figure 14:
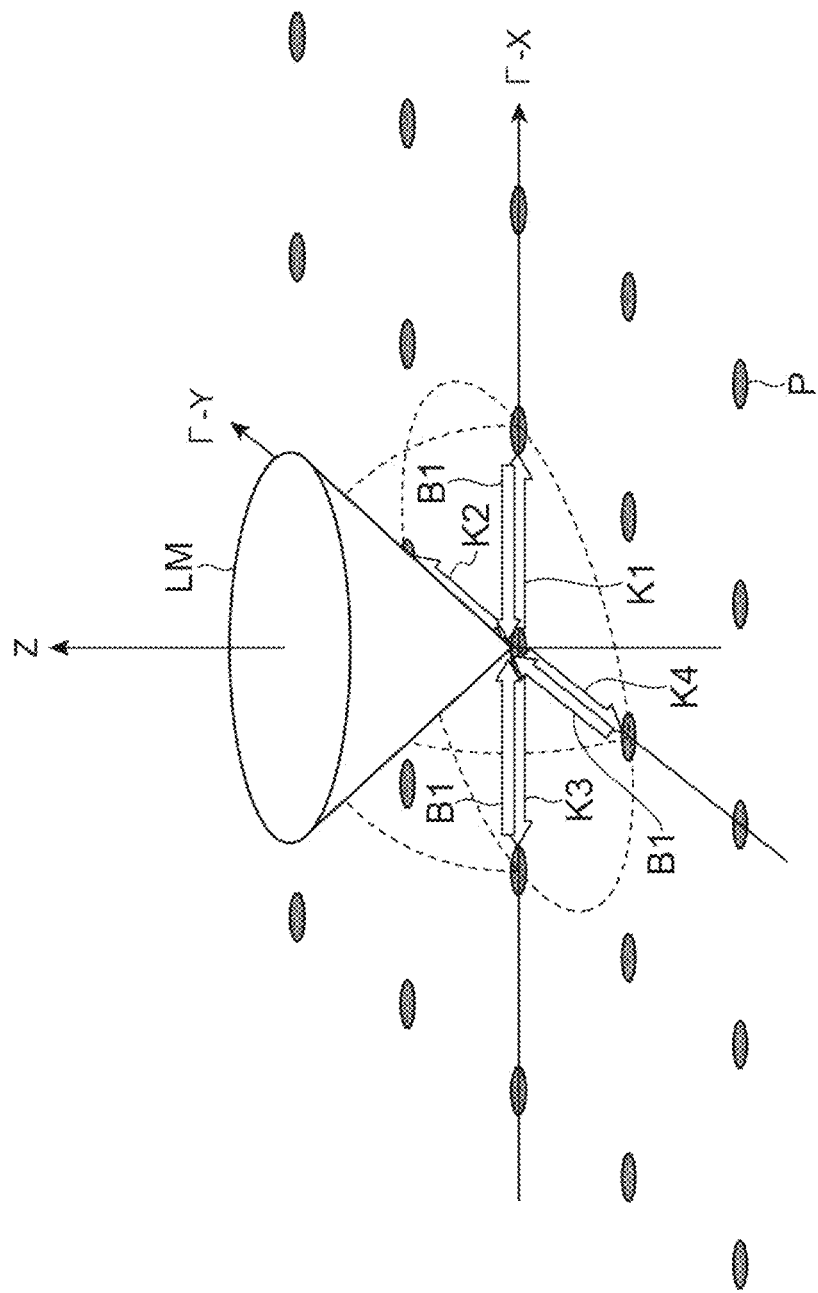
FIG. 14 is a three-dimensional perspective view of the reciprocal lattice space illustrated in FIG. 13.

FIG. 14 is a three-dimensional perspective view of the reciprocal lattice space illustrated in FIG. 13. FIG. 14 illustrates the Z-axis orthogonal to a direction along the Γ-X axis and a direction along the Γ-Y axis. This Z-axis is the same as the Z-axis illustrated in FIG. 1. As illustrated in FIG. 14, in the case of the S-iPM laser oscillating at the F point, an optical image (beam pattern) LM having a two-dimensional spread including not only the zero-order light in the plane vertical direction (Z-axis direction) but also +1-order light and the −1-order light in the direction inclined with respect to the Z-axis direction is outputted.

Figure 15:
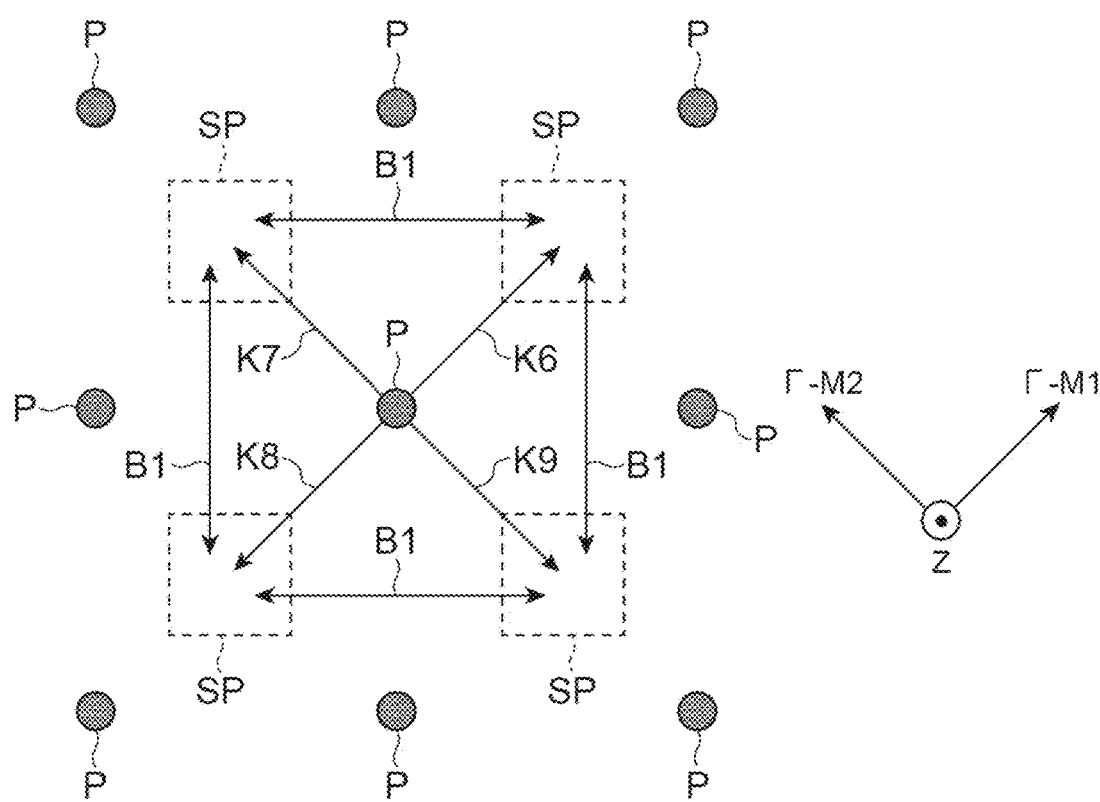
FIG. 15 is a plan view illustrating a reciprocal lattice space related to a phase modulation layer of an S-iPM laser oscillating at the point M.

Next, the S-iPM laser oscillating at the point M will be described. The condition of the M-point oscillation is the same as that in the case of the above-described PCSEL. FIG. 15 is a plan view illustrating the reciprocal lattice space for the phase modulation layer of the S-iPM laser oscillating at the point M. The basic reciprocal lattice vector B1 is the same as that in the PCSEL of the M-point oscillation (see FIG. 12), but the in-plane wavenumber vectors K6 to K9 each have the wavenumber spread SP due to the rotation angle distribution φ(x, y). A shape and a magnitude of the wavenumber spread SP are the same as those in the case of the above-described Γ-point oscillation. Even in the S-iPM laser, the magnitudes of the in-plane wavenumber vectors K6 to K9 (that is, the magnitudes of the standing waves in the in-plane direction) are smaller than the magnitude of the basic reciprocal lattice vector B1 in the case of the M-point oscillation (the wavenumber in the in-plane direction cannot be 0 due to diffraction, and diffraction in the plane vertical direction (Z-axis direction) does not occur). Accordingly, the zero-order light in the plane vertical direction (Z-axis direction) and both the +1-order light and the −1-order light in the direction inclined with respect to the Z-axis direction are not outputted.

Figure 16:
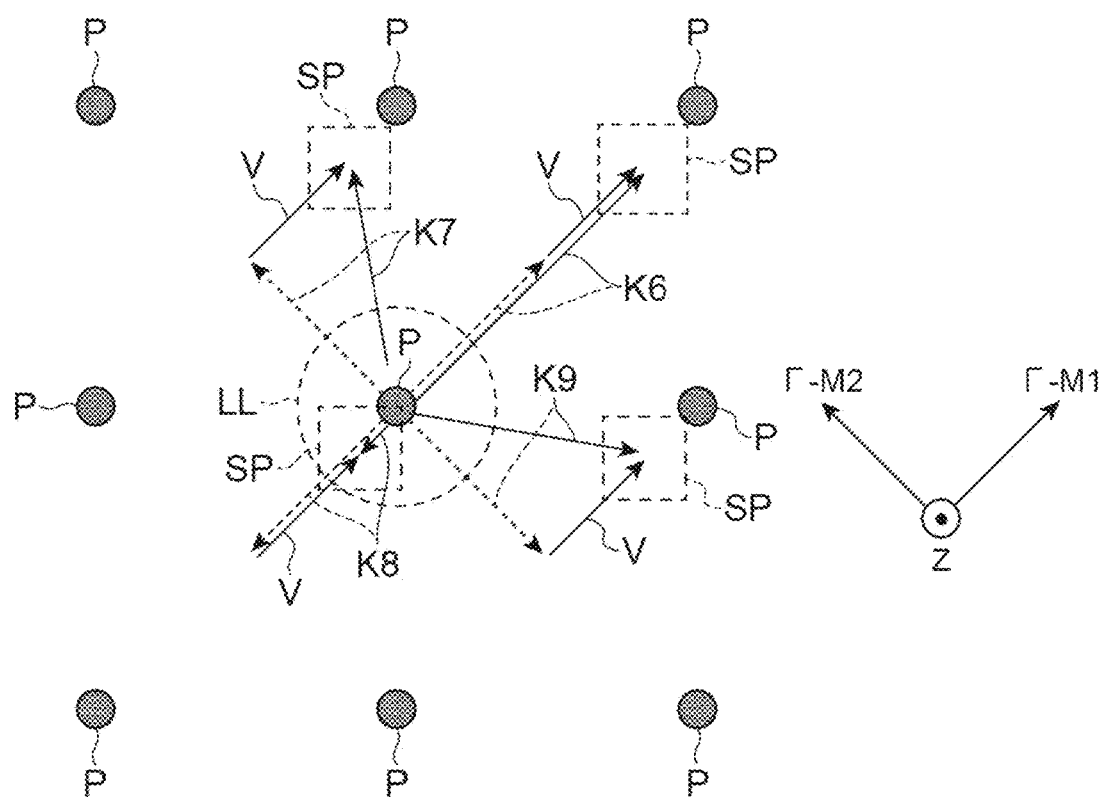
FIG. 16 is a conceptual diagram for describing an operation of adding a diffraction vector V having certain constant magnitude and orientation with respect to in-plane wavenumber vectors K6 to K9.

Here, in the present embodiment, the phase modulation layer 15A in the S-iPM laser oscillating at the M point is devised as follows, and thus, a part of the +1-order light and the −1-order light is outputted without outputting the zero-order light. Specifically, as illustrated in FIG. 16, a diffraction vector V having a certain magnitude and direction is added to the in-plane wavenumber vectors K6 to K9, and thus, the magnitude of at least one (the in-plane wavenumber vector K8 in this drawing) of the in-plane wavenumber vectors K6 to K9 is set to be smaller than $2\pi/\lambda$. In other words, at least one of the in-plane wavenumber vectors K6 to K9 (the in-plane wavenumber vector K8) after the diffraction vector V is added is included within a circular region (light line) LL having a radius of $2\pi/\lambda$. The in-plane wavenumber vectors K6 to K9 represented by broken lines in FIG. 16 represent vectors before the addition of the diffraction vector V, and the in-plane wavenumber vectors K6 to K9 represented by solid lines represent vectors after the addition of the diffraction vector V. The light line LL corresponds to a total reflection condition, and the wavenumber vector having a magnitude for including the in-plane wavenumber vector in the light line LL has a component in the plane vertical direction (Z-axis direction). In one example, a direction of the diffraction vector V is along the Γ-M1 axis or the Γ-M2 axis, and a magnitude thereof is in a range of $2\pi/(\sqrt{2})a-\pi/\lambda$ to $2\pi/(\sqrt{2})a+\pi r/\lambda$ (for example, $2\pi/(\sqrt{2})a$).

The magnitude and orientation of the diffraction vector V for including at least one of the in-plane wavenumber vectors K6 to K9 in the light line LL are examined. The following Formulas (10) to (13) indicate the in-plane wavenumber vectors K6 to K9 before the diffraction vector V is applied.

$$K6 = \left(\frac{\pi}{a} + \Delta kx, \ \frac{\pi}{a} + \Delta ky\right) \tag{10}$$

$$K7 = \left(-\frac{\pi}{a} + \Delta kx, \ \frac{\pi}{a} + \Delta ky\right) \tag{11}$$

$$K8 = \left(-\frac{\pi}{a} + \Delta kx, \ -\frac{\pi}{a} + \Delta ky\right) \tag{12}$$

$$K9 = \left(\frac{\pi}{a} + \Delta kx, \ -\frac{\pi}{a} + \Delta ky\right) \tag{13}$$

Wavenumber vector spreads $\Delta kx$ and $\Delta ky$ satisfy the following Formula (14) and Formula (15), and a maximum value $\Delta kx_{max}$ of the in-plane wavenumber vector spread in the x-axis direction and a maximum value $\Delta ky_{max}$ of the spread in the y-axis direction are defined by the angle spread of the light forming the optical image in design.

$$-\Delta kx_{max} \leq \Delta kx \leq \Delta kx_{max} \tag{14}$$

$$-\Delta ky_{max} \leq \Delta ky \leq \Delta ky_{max} \tag{15}$$

Here, when the diffraction vector V is expressed by the following Formula (16), the in-plane wavenumber vectors K6 to K9 after the diffraction vector V is added becomes the following Formula (17) to Formula (20).

$$V=(Vx,Vy) \tag{16}$$

$$K6 = \left(\frac{\pi}{a} + \Delta kx + Vx, \ \frac{\pi}{a} + \Delta ky + Vy\right) \tag{17}$$

$$K7 = \left(-\frac{\pi}{a} + \Delta kx + Vx, \ \frac{\pi}{a} + \Delta ky + Vy\right) \tag{18}$$

$$K8 = \left(-\frac{\pi}{a} + \Delta kx + Vx, \ -\frac{\pi}{a} + \Delta ky + Vy\right) \tag{19}$$

$$K9 = \left(\frac{\pi}{a} + \Delta kx + Vx, \ -\frac{\pi}{a} + \Delta ky + Vy\right) \tag{20}$$

When it is considered that any of the wavenumber vectors K6 to K9 is included in the light line LL in the above Formula (17) to Formula (20), a relationship of the following Formula (21) is established.

$$\left(\pm\frac{\pi}{a} + \Delta kx + Vx\right)^2 + \left(\pm\frac{\pi}{a} + \Delta ky + Vy\right)^2 < \left(\frac{2\pi}{\lambda}\right)^2 \tag{21}$$

That is, the diffraction vector V satisfying the above Formula (21) is added, and thus, any of the wavenumber vectors K6 to K9 is included in the light line LL. Accordingly, a part of the +1-order light and the −1-order light is outputted.

Figure 17:
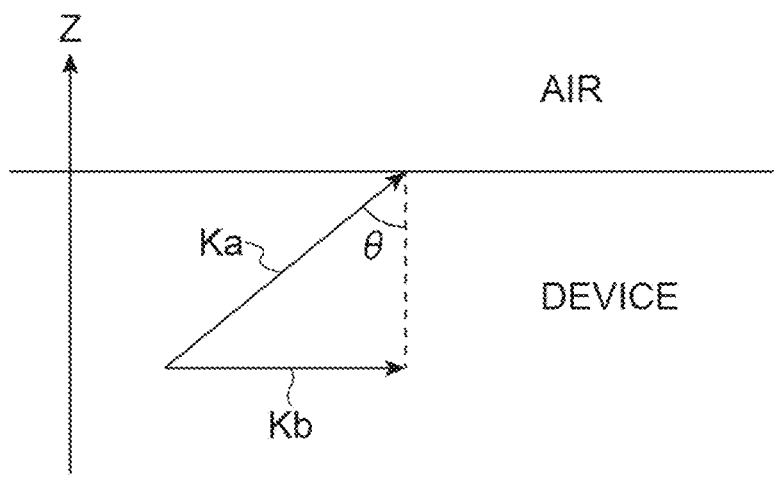
FIG. 17 is a diagram for schematically describing a peripheral structure of a light line LL.

The reason why the size (radius) of the light line LL is set to $2\pi/\lambda$ is as follows. FIG. 17 is a diagram for schematically describing a peripheral structure of the light line LL, and illustrates a boundary between the device and air as viewed from a direction perpendicular to the Z-axis direction. Although a magnitude of a wavenumber vector of light in a vacuum is $2\pi/\lambda$, when light propagates in a device medium as illustrated in FIG. 17, a magnitude of a wavenumber vector Ka in a medium having a refractive index n is $2\pi n/\lambda$. At this time, in order for the light to propagate at the boundary between the device and the air, a wavenumber component parallel to the boundary needs to be continuous (wavenumber conservation law). When the wavenumber vector Ka and the Z-axis form an angle θ in FIG. 17, a length of a wavenumber vector (that is, the in-plane wavenumber vector) Kb projected in the plane is $(2\pi n/\lambda)\sin\theta$. On the other hand, in general, the wavenumber conservation law is not established at an angle at which the in-plane wavenumber vector Kb in the medium is larger than $2\pi/\lambda$ from a relationship of the refractive index n of the medium >1. At this time, the light is totally reflected and cannot be taken out to the air side. The magnitude of the wavenumber vector corresponding to this total reflection condition is the magnitude of the light line LL and is $2\pi/\lambda$.

A method of superimposing a rotation angle distribution $\varphi_2(x, y)$ (second phase distribution) unrelated to the optical image on a rotation angle distribution $\varphi_1(x, y)$ (first phase distribution) which is a phase distribution for forming a desired optical image is considered as an example of a specific method of adding the diffraction vector V to the in-plane wavenumber vectors K6 to K9. In this case, the rotation angle distribution $\varphi(x, y)$ of the phase modulation layer 15A is represented as the following formula.

$$\varphi(x,y)=\varphi_1(x,y)+\varphi_2(x,y)$$

Figure 18:
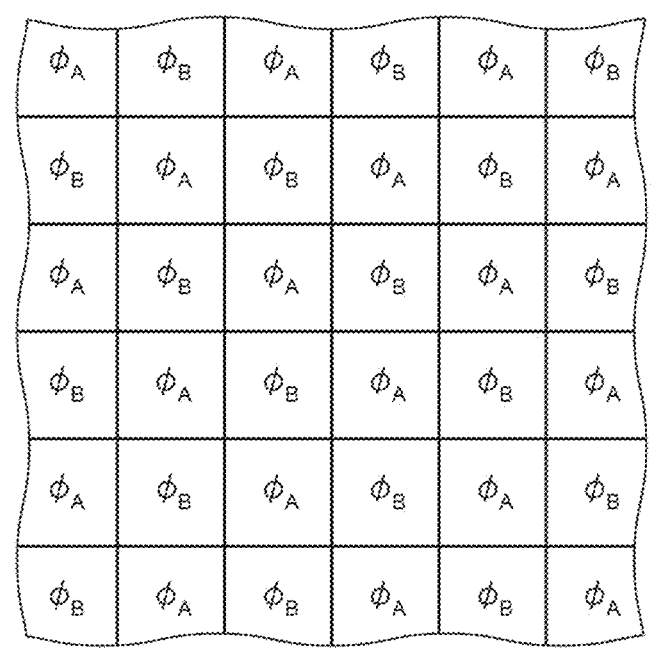

$\varphi_1(x, y)$ corresponds to the phase of the complex amplitude when the inverse Fourier transform is performed on the optical image as described above. $\varphi_2(x, y)$ is a rotation angle distribution for adding the diffraction vector V satisfying the above Formula (21). FIG. 18 is a diagram conceptually illustrating an example of the rotation angle distribution $\varphi_2(x, y)$. As illustrated in FIG. 18, in this example, first phase values $\varphi_A$ and second phase values $\varphi_B$ having a value different from the first phase values $\varphi_A$ are arranged in a check pattern. That is, the second phase values $\varphi_B$ having the value different from the first phase values $\varphi_A$ are alternately arranged along the two orthogonal directions. In one example, the phase value $\varphi_A$ is 0 (rad) and the phase value $\varphi_B$ is π(rad). That is, the first phase value $\varphi_A$ and the second phase value $\varphi_B$ change by π. With such the arrangement of the phase values, the diffraction vector V along the Γ-M1 axis or the Γ-M2 axis can be suitably realized. When the first phase values $\varphi_A$ and the second phase values $\varphi_B$ are arranged in the check pattern as described above, the diffraction vector V is exactly offset by the wavenumber vectors K6 to K9 in FIG. 15 like V=(±π/a, ±π/a). The orientation of the diffraction vector V can be adjusted to any direction by changing the arrangement direction of the phase values $\varphi_A$ and $\varphi_B$ from 45°.

In the above-described structure, materials, a film thickness, and a structure of the layers can be variously changed as long as the structure includes the active layer 12 and the phase modulation layer 15A. Here, the scaling law is established for so-called square lattice photonic crystal laser when the perturbation from the virtual square lattice is 0. That is, when the wavelength becomes a multiple of a constant α, the same standing wave state can be obtained by multiplying the entire square lattice structure by α. Similarly, in the present embodiment, the structure of the phase modulation layer 15A can be decided according to the scaling law corresponding to the wavelength. Accordingly, the semiconductor light emission element 1A that outputs visible light can be realized by using the active layer 12 that emits light of blue, green, red, and the like and applying the scaling law corresponding to the wavelength.

When the semiconductor light emission element 1A is manufactured, a metal organic chemical vapor deposition (MOCVD) method or a molecular beam epitaxy method (MBE) is applied to the growth of each compound semiconductor layer. In the manufacturing of the semiconductor light emission element 1A using AlGaAs, a growth temperature of AlGaAs is 500° C. to 850° C., and 550 to 700° C. is adopted in an experiment. Trimethylaluminum (TMA) as an Al raw material during growth, trimethylgallium (TMG) and triethylgallium (TEG) as a gallium raw material, $AsH_3$ (arsine) as an As raw material, $Si_2H_6$ (disilane) as a raw material for n-type impurities, and DEZn (diethylzinc) as a raw material for p-type impurities are used. TMG and arsine are used in the growth of GaAs, but TMA is not used. InGaAs is manufactured by using TMG, trimethylindium (TMI) and arsine. An insulating film may be formed by sputtering a target by using a constituent material as a raw material or by a plasma CVD (PCVD) method.

That is, in the above-described semiconductor light emission element 1A, first, an AlGaAs layer as the n-type cladding layer 11, an InGaAs/AlGaAs multiple quantum well structure as the active layer 12, and a GaAs layer as the base layer 15a of the phase modulation layer 15A are epitaxially grown on a GaAs substrate as an n-type semiconductor substrate 10 in sequence by using a metalorganic vapor phase growth (MOCVD) method.

Next, another resist is applied to the base layer 15a. After a two-dimensional fine pattern is drawn on the resist by an electron beam drawing apparatus, the two-dimensional fine pattern is formed on the resist by developing the drawn resist. Thereafter, the two-dimensional fine pattern is transferred onto the base layer 15a by dry etching with the resist as a mask, and holes are formed in the base layer 15a. Thereafter, the resist is removed. An SiN layer or an $SiO_2$ layer may be formed on the base layer 15a by the PCVD method before the resist is formed, and the resist mask may be formed on the SiN layer or the $SiO_2$ layer. Subsequently, after the fine pattern is transferred onto the SiN layer or the $SiO_2$ layer by using reactive ion etching (RIE), the resist may be removed and then dry etching may be performed. In this case, resistance to the dry etching can be increased. These holes are used as the modified refractive index regions 15b, or the compound semiconductor (AlGaAs) which becomes the modified refractive index regions 15b is regrown in these holes so as to have a depth equal to or deeper than these holes. When the holes are used as the modified refractive index regions 15b, a gas such as air, nitrogen, hydrogen, or argon may be sealed in the holes. Subsequently, an AlGaAs layer as the cladding layer 13 and a GaAs layer as the contact layer 14 are sequentially formed by the MOCVD, and the electrodes 16 and 17 are formed by a vapor deposition method or a sputtering method. If necessary, the protective film 18 and the antireflection film 19 are formed by the sputtering or PCVD method, or the like.

When the phase modulation layer 15A is provided between the active layer 12 and the cladding layer 11, the phase modulation layer 15A may be formed on the cladding layer 11 before the active layer 12 is formed.

Effects obtained by the semiconductor light emission element 1A according to the present embodiment described above will be described. In this semiconductor light emission element 1A, the centers of gravity G of the plurality of modified refractive index regions 15b are arranged apart from the corresponding lattice points O of the virtual square lattice, and have the rotation angles corresponding to the optical image around the lattice points O. According to such a structure, the light forming the optical image in any shape along the normal direction (Z-axis direction) of the main surface 10a of the semiconductor substrate 10, the inclination direction intersecting the normal direction, or both the directions can be outputted as the S-iPM laser. In the semiconductor light emission element 1A, the lattice spacing a of the virtual square lattice and the emission wavelength λ of the active layer 12 satisfy the condition of the M-point oscillation. Normally, in the standing wave state of the M-point oscillation, the light propagating in the phase modulation layer 15A is totally reflected, and the outputs of both the signal light (the +1-order light and the −1-order light) and the zero-order light are suppressed. However, in the semiconductor light emission element 1A of the present embodiment, the magnitude of at least one of the in-phase wavenumber vectors K6 to K9 in four directions which are the in-plane wavenumber vectors formed in the reciprocal lattice space of the phase modulation layer 15A and each include the wavenumber spread Δk due to the rotation angle distribution φ(x, y) is smaller than 2π/λ (light line LL). In the S-iPM laser, for example, the in-plane wavenumber vectors K6 to K9 can be adjusted by devising the rotation angle distribution φ(x, y). When the magnitude of at least one in-plane wavenumber vector is smaller than 2π/λ, the in-plane wavenumber vector has a component in the Z-axis direction, and thus, a part of the signal light is outputted from the phase modulation layer 15A. However, since the zero-order light is still confined in the plane in the direction coinciding with any one of the four wavenumber vectors (±π/a, ±π/a) that form the standing waves at the point M, the zero-order light is not outputted into the light line from the phase modulation layer 15A. That is, according to the semiconductor light emission element 1A of the present embodiment, the zero-order light included in the output of the S-iPM laser can be removed from the light line, and only the signal light can be outputted into the light line.

As in the present embodiment, the rotation angle distribution φ(x, y) may be obtained by superimposing the rotation angle distribution $\varphi_1(x, y)$ corresponding to the optical image on the rotation angle distribution $\varphi_2(x, y)$ unrelated to the optical image. In this case, the rotation angle distribution $\varphi_2(x, y)$ may be the rotation angle distribution for adding the diffraction vectors V having certain constant magnitude and orientation to the in-plane wavenumber vectors K6 to K9 in the four directions due to the rotation angle distribution $\varphi_1(x, y)$ in the inverse lattice space of the phase modulation layer 15A. As a result of adding the diffraction vector V to the in-plane wavenumber vectors K6 to K9 in the four directions, the magnitude of at least one of the in-plane wavenumber vectors K6 to K9 in the four directions may be smaller than $2\pi/\lambda$. Accordingly, a configuration in which the magnitude of at least one of the in-plane wavenumber vectors K6 to K9 in the four directions including the wavenumber spreads $\Delta kx$ and $\Delta ky$ due to the rotation angle distribution $\varphi(x, y)$ is smaller than $2\pi/\lambda$ (light line) in the reciprocal lattice space can be easily realized.

As in the present embodiment, the rotation angle distribution $\varphi_2(x, y)$ may be a pattern in which the phase values $\varphi_A$ and $\varphi_B$ having different values are arranged in the check pattern. With such a rotation angle distribution $\varphi_2(x, y)$, the above-described diffraction vector V can be easily realized.

Figure 19:
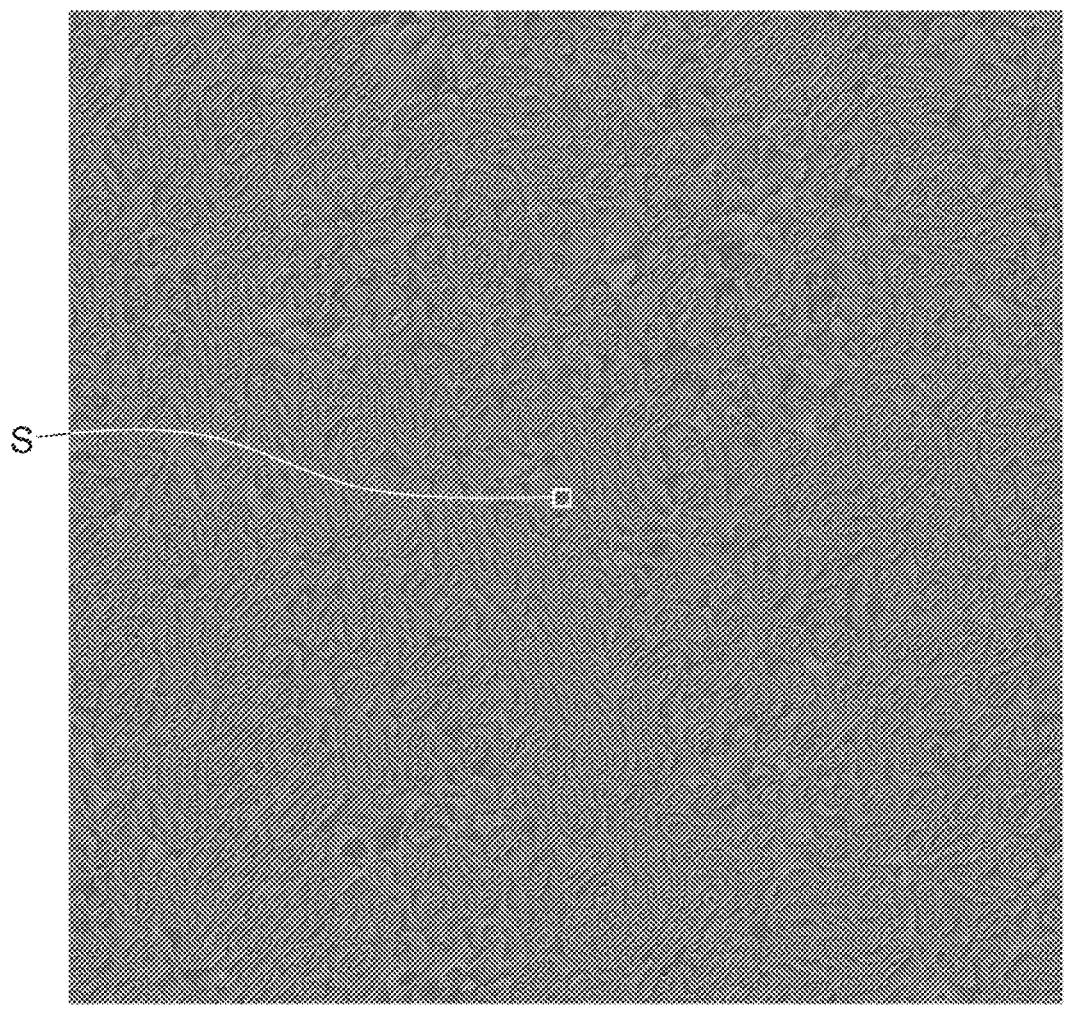
FIG. 19 is a diagram illustrating an example of a rotation angle distribution φ(x, y) of the phase modulation layer 15A.
Figure 20:
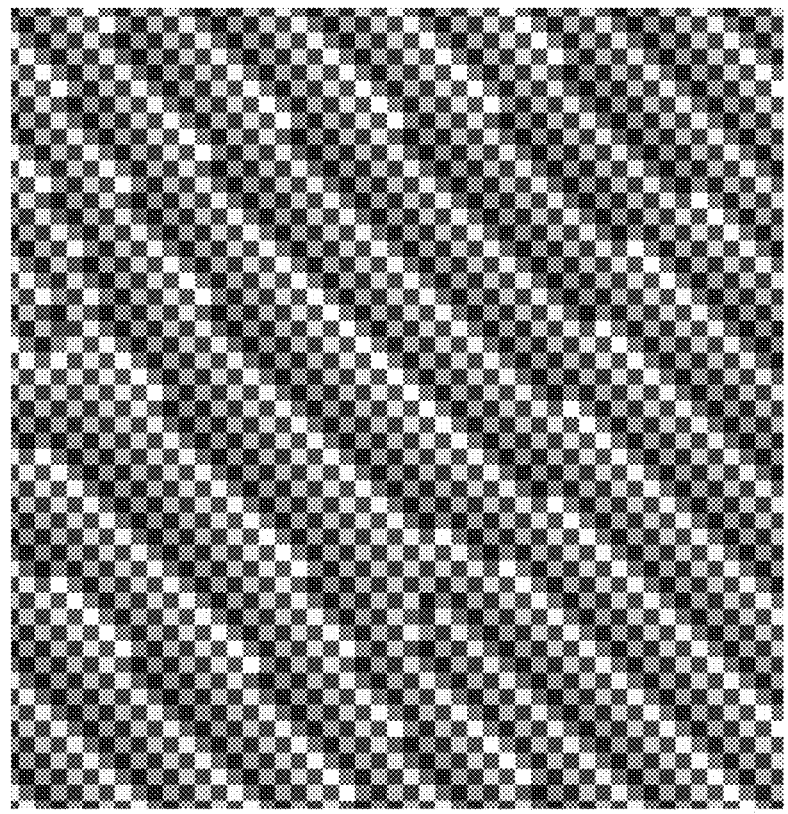
FIG. 20 is an enlarged view of a portion S illustrated in FIG. 19.
Figure 21:
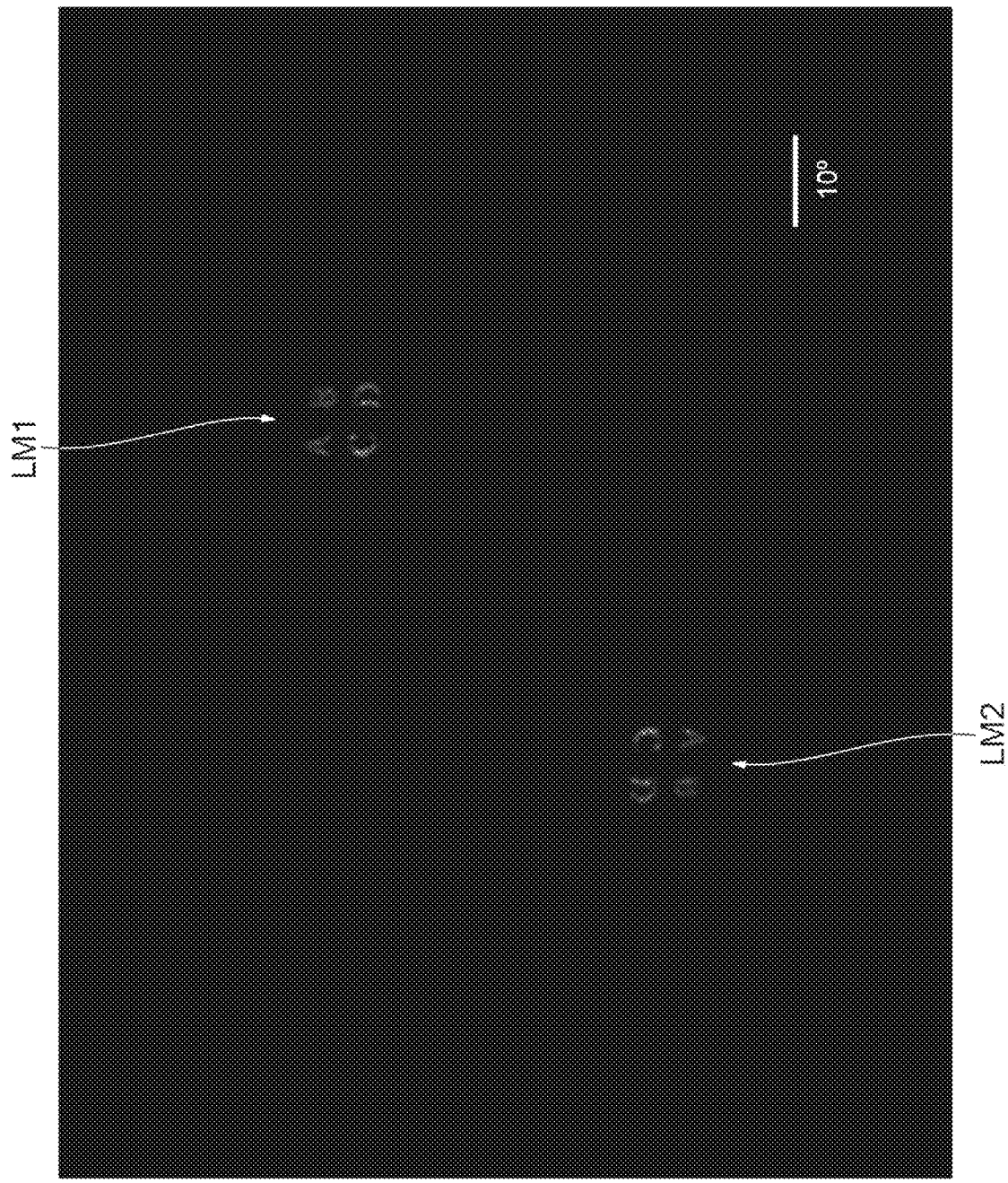
FIG. 21 illustrates a beam pattern (optical image) outputted from the semiconductor light emission element 1A having the rotation angle distribution φ(x, y) illustrated in FIG. 19.
Figure 22:
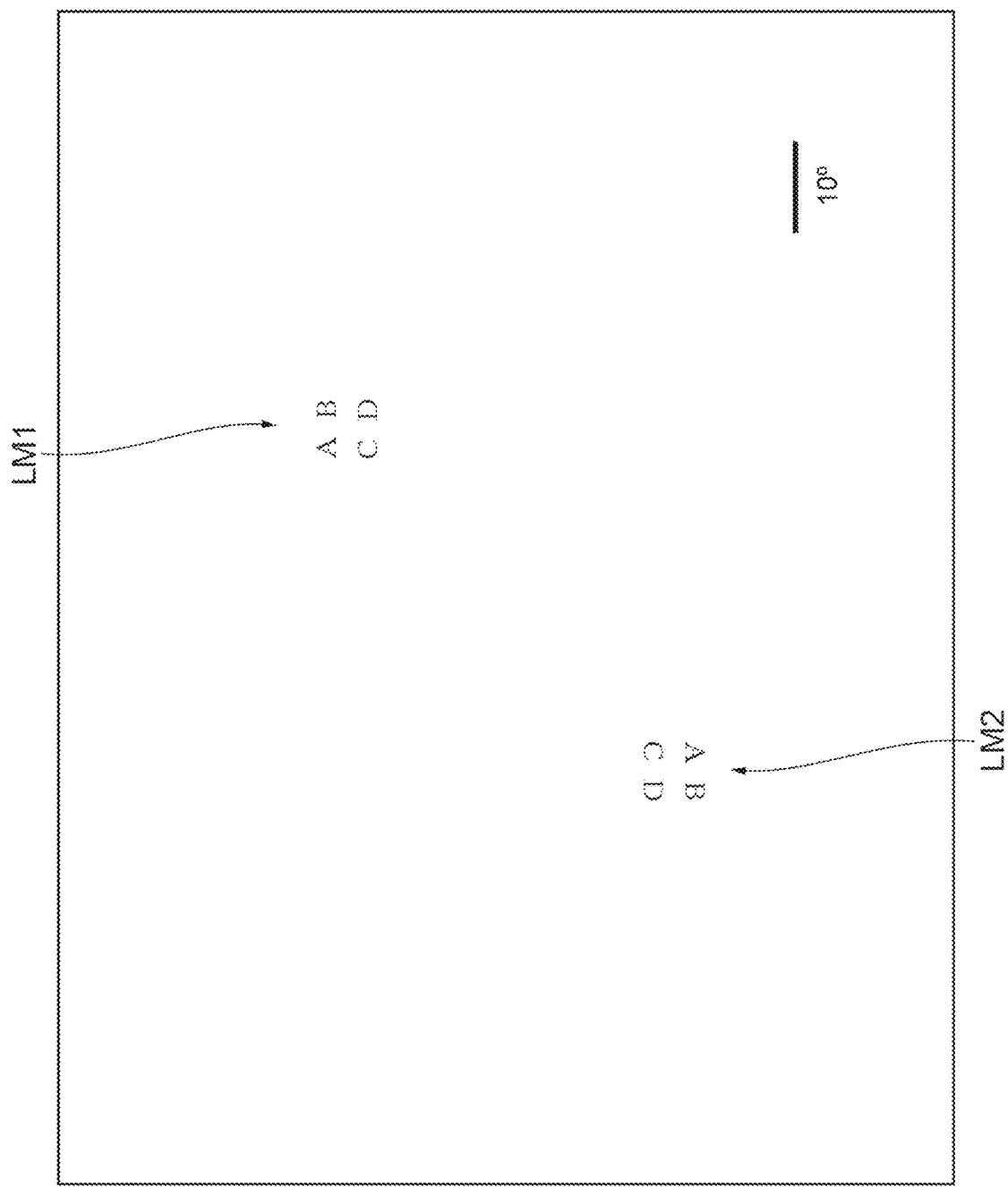
FIG. 22 is a schematic diagram of the beam pattern illustrated in FIG. 21.
Figure 23A:
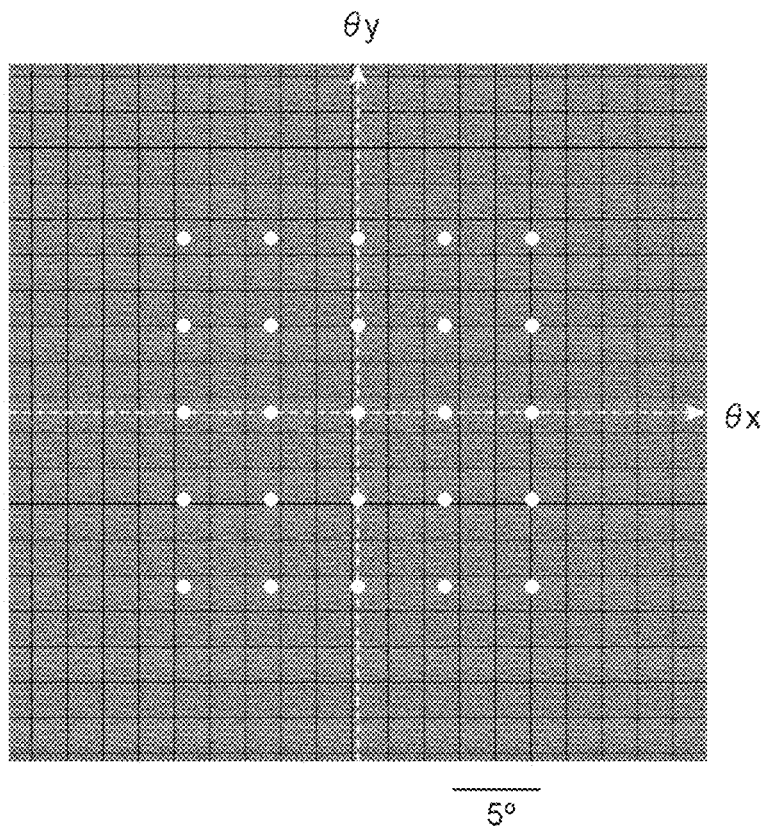
FIG. 23A is a schematic diagram of a beam pattern.
Figure 23B:
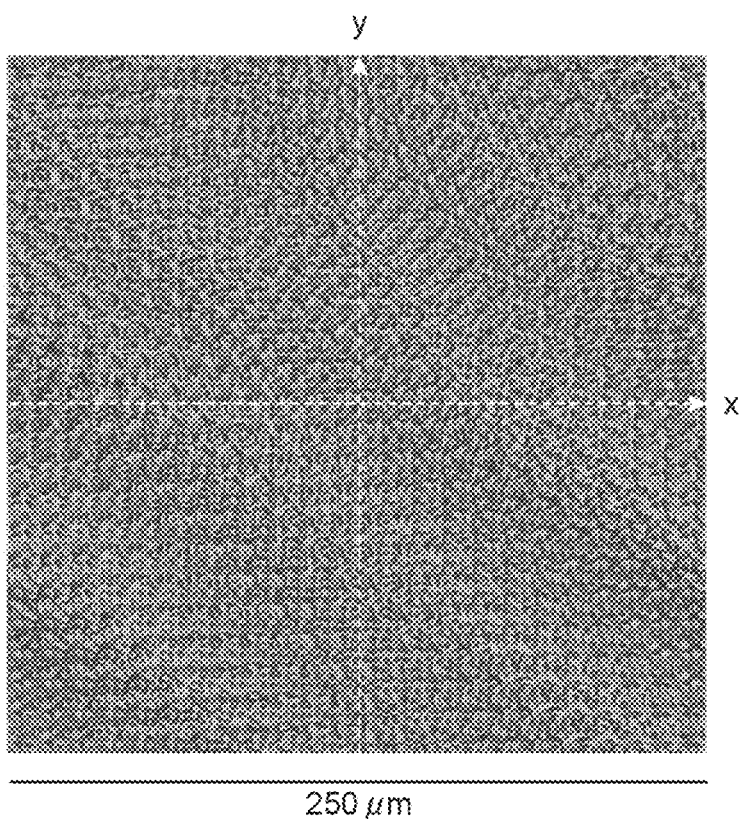
FIG. 23B is a diagram illustrating a phase distribution of the beam pattern.
Figure 24A:
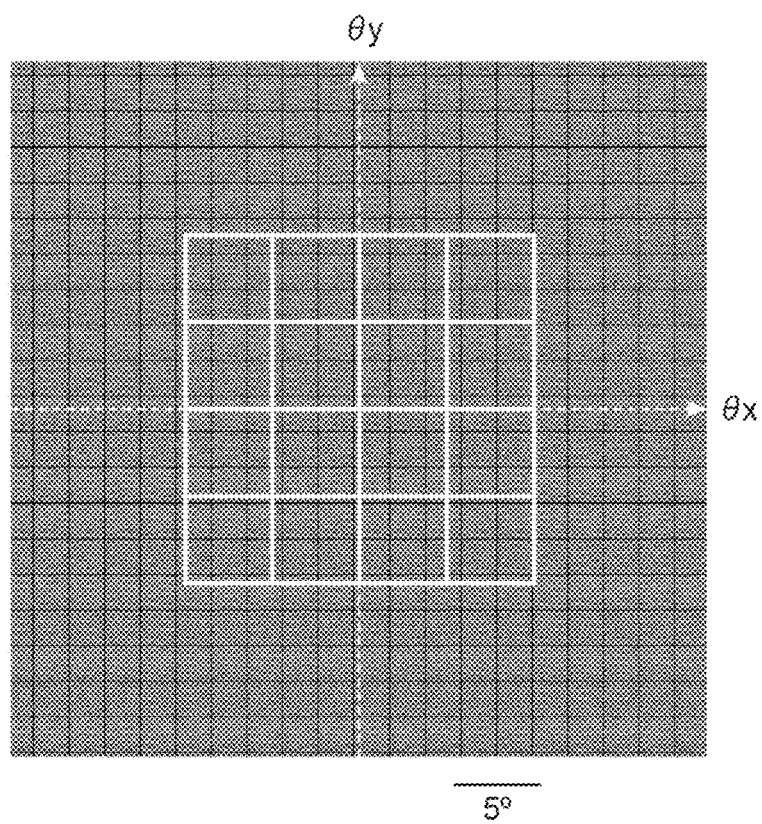
FIG. 24A is a diagram of a beam pattern.
Figure 24B:
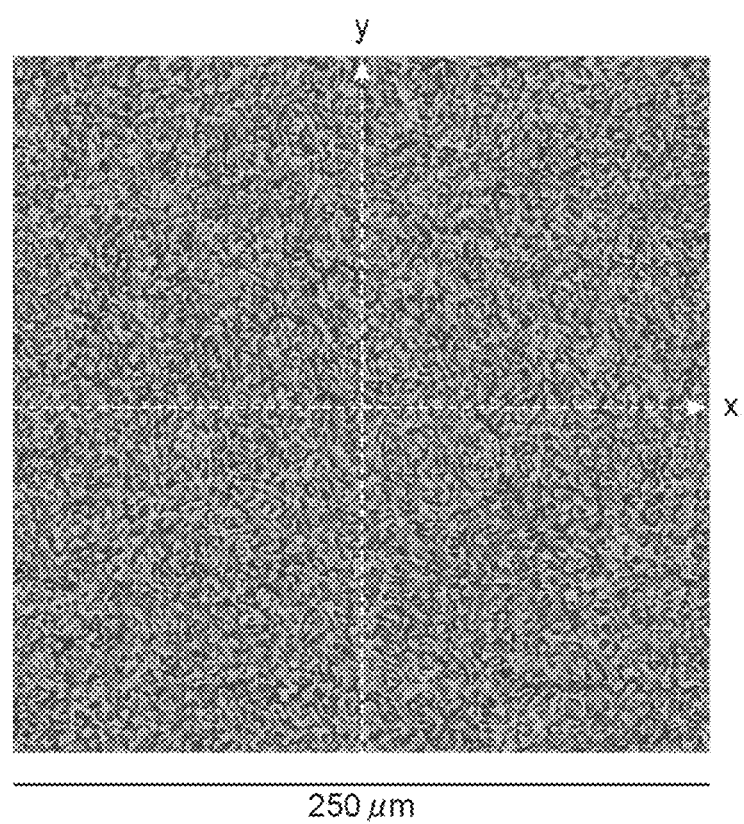
FIG. 24B is a diagram illustrating a phase distribution of the beam pattern.
Figure 25A:
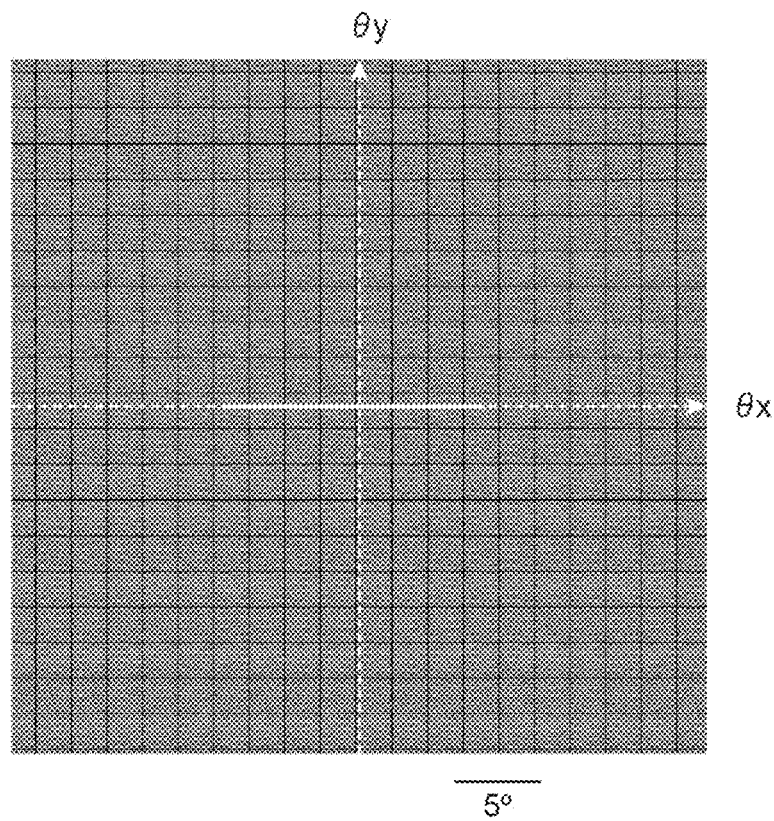
FIG. 25A is a schematic diagram of a beam pattern.
Figure 25B:
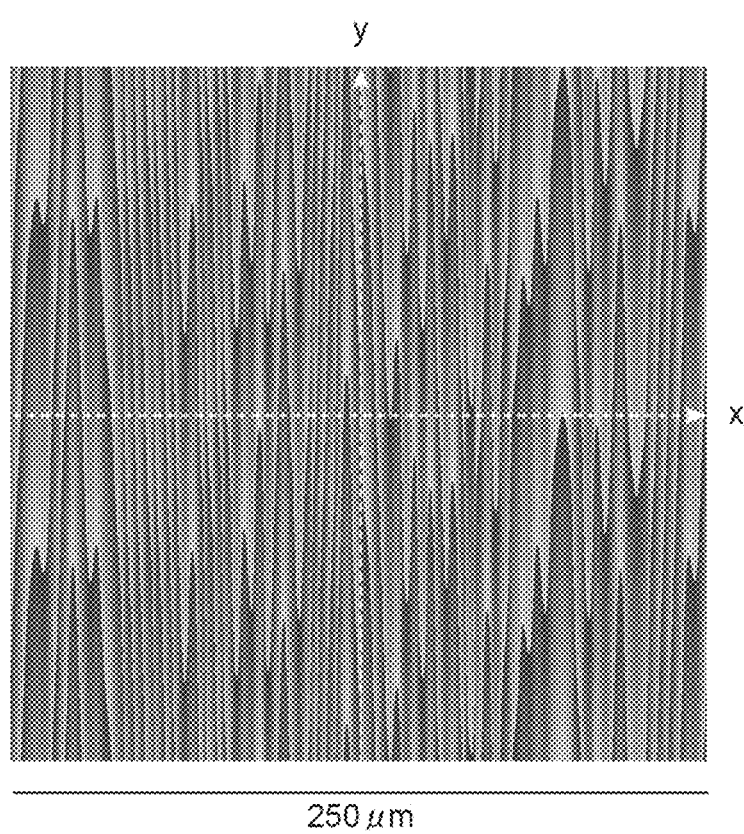
FIG. 25B is a diagram illustrating a phase distribution of the beam pattern.

FIG. 19 is a diagram illustrating an example of the rotation angle distribution $\varphi(x, y)$ of the phase modulation layer 15A. FIG. 20 is an enlarged view of a portion S illustrated in FIG. 19. In FIGS. 19 and 20, a magnitude of a rotation angle is represented by shades of color, and as the region becomes darker, the rotation angle becomes larger (that is, a phase angle becomes larger). It can be seen from FIG. 20 that patterns in which phase values having different values are arranged in a check pattern are superimposed. FIG. 21 illustrates a beam pattern (optical image) outputted from the semiconductor light emission element 1A having the rotation angle distribution $\varphi(x, y)$ illustrated in FIG. 19. FIG. 22 is a schematic diagram of the beam pattern illustrated in FIG. 21. Centers of FIGS. 21 and 22 correspond to the Z-axis. As is clear from FIGS. 21 and 22, the semiconductor light emission element 1A outputs +1-order light including a first optical image portion LM1 outputted in a first direction inclined with respect to the Z-axis and −1-order light including a second optical image portion LM2 which is outputted in a second direction symmetrical to the first direction with respect to the Z-axis and is rotationally symmetric with the first optical image portion LM1 with respect to the Z-axis, but does not output zero-order light traveling on the Z-axis.

In the present embodiment, the pattern that includes the Z-axis and is symmetrical with respect to the Z-axis can be outputted. At this time, since there is no zero-order light, unevenness in intensity of the pattern does not occur even on the Z-axis. Design examples of such beam patterns include 5×5 multipoints, mesh, and one-dimensional pattern. Schematic diagrams and phase distributions of these beam patterns are illustrated in FIGS. 23A, 23B, 24A, 24B, 25A and 25B. Such a beam pattern can be applied to, for example, object detection and three-dimensional measurement, and an eye-safe light source can be provided by using an eye-safe wavelength or the like.

First Modification Example

In the above-described embodiment, when the wavenumber spread based on the angle spread of the optical image is included in a circle having a radius $\Delta k$ with a certain point of the wavenumber space as a center, it is possible to simply consider as follows. The diffraction vector V is added to the in-plane wavenumber vectors K6 to K9 in the four directions, and thus, the magnitude of at least one of the in-plane wavenumber vectors K6 to K9 in the four directions is set to be smaller than $2\pi/\lambda$. (light line LL). It may be considered that the diffraction vector V is added to the in-plane wavenumber vector excluding the wavenumber spread $\Delta k$ from the in-plane wavenumber vectors K6 to K9 in the four directions (that is, the in-plane wavenumber vectors in the four directions in the square lattice PCSEL of the M-point oscillation, see FIG. 12), and thus, the magnitude of at least one of the in-plane wavenumber vectors K6 to K9 in the four directions is set to be smaller than a value $\{(2\pi/\lambda)-\Delta k\}$ obtained by subtracting the wavenumber spread $\Delta k$ from $2\pi/\lambda$.

Figure 26:
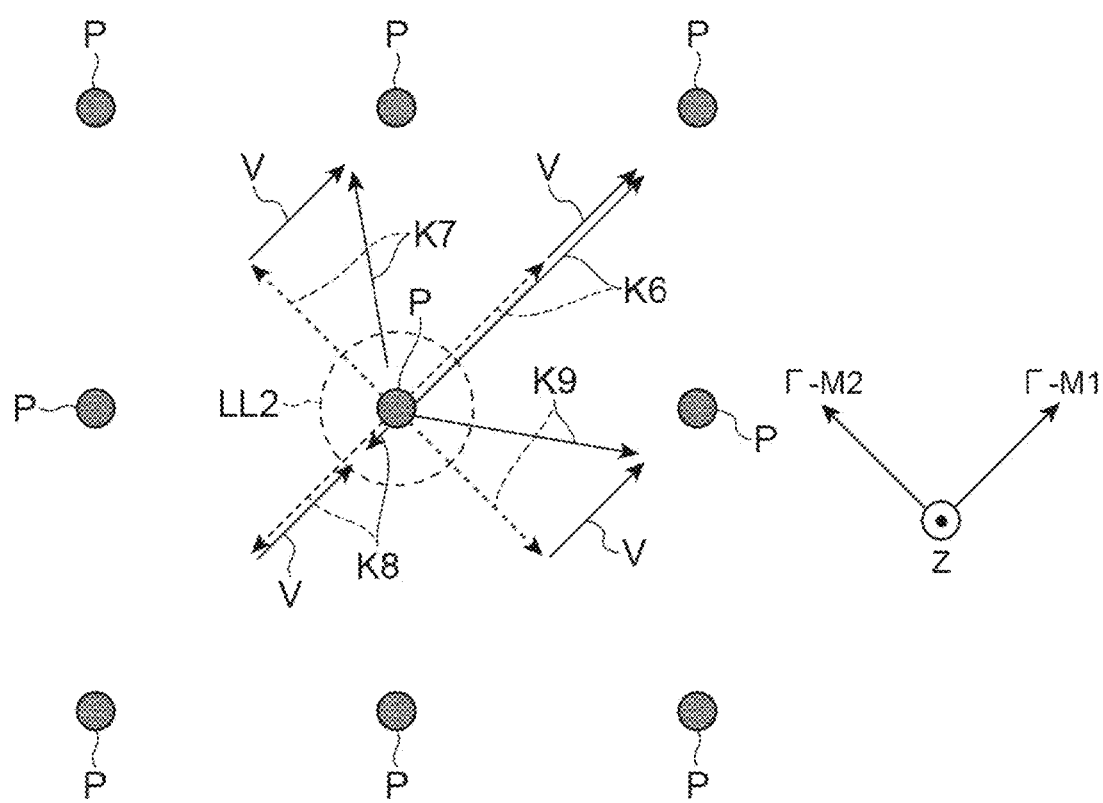
FIG. 26 is a conceptual diagram for describing an operation of adding the diffraction vector V to the in-plane wavenumber vector excluding a wavenumber spread Δk from the in-plane wavenumber vectors K6 to K9 in four directions.

FIG. 26 is a diagram conceptually illustrating the above-described operation. As illustrated in this drawing, the diffraction vector V is added to the in-plane wavenumber vectors K6 to K9 excluding the wavenumber spread $\Delta k$, and thus, the magnitude of at least one of the in-plane wavenumber vectors K6 to K9 is set to be smaller than $\{(2\pi/\lambda)-\Delta k\}$. In this drawing, a region LL2 is a circular region having a radius of $\{(2\pi/\lambda)-\Delta k\}$. In FIG. 26, the in-plane wavenumber vectors K6 to K9 represented by broken lines represent before the addition of the diffraction vector V, and the in-plane wavenumber vectors K6 to K9 represented by solid lines represent after the addition of the diffraction vector V. The region LL2 corresponds to a region where an effect of the wavenumber spread $\Delta k$ of the beam pattern is subtracted from the total reflection condition, and the wavenumber vector having the magnitude for including the in-plane wavenumber vector in the region LL2 propagates in the plane vertical direction (Z-axis direction).

In the present modification example, the magnitude and orientation of the diffraction vector V for including at least one of the in-plane wavenumber vectors K6 to K9 in the region LL2 will be described. The following Formula (22) to Formula (25) represent the in-plane wavenumber vectors K6 to K9 before the diffraction vector V is added.

$$K6 = \left(\frac{\pi}{a}, \frac{\pi}{a}\right) \quad (22)$$

$$K7 = \left(-\frac{\pi}{a}, \frac{\pi}{a}\right) \quad (23)$$

$$K8 = \left(-\frac{\pi}{a}, -\frac{\pi}{a}\right) \quad (24)$$

$$K9 = \left(\frac{\pi}{a}, -\frac{\pi}{a}\right) \quad (25)$$

Here, when the diffraction vector V is represented as the above Formula (16), the in-plane wavenumber vectors K6 to K9 after the diffraction vector V is added becomes the following Formula (26) to Formula (29).

$$K6 = \left(\frac{\pi}{a} + Vx, \frac{\pi}{a} + Vy\right) \quad (26)$$

$$K7 = \left(-\frac{\pi}{a} + Vx, \frac{\pi}{a} + Vy\right) \quad (27)$$

$$K8 = \left(-\frac{\pi}{a} + Vx, -\frac{\pi}{a} + Vy\right) \quad (28)$$

-continued $$K9 = \left(\frac{\pi}{a} + Vx, -\frac{\pi}{a} + Vy\right) \qquad (29)$$

When it is considered that any of the in-plane wavenumber vectors K6 to K9 is included in the region LL2 in the above Formula (26) to Formula (29), the following Formula (30) is established.

$$\left(\pm\frac{\pi}{a} + Vx\right)^2 + \left(\pm\frac{\pi}{a} + Vy\right)^2 < \left(\frac{2\pi}{\lambda} - \Delta k\right)^2 \qquad (30)$$

That is, the diffraction vector V satisfying the above Formula (30) is added, and thus, any of the in-plane wavenumber vectors K6 to K9 excluding the wavenumber spread Δk is included in the region LL2. Even in such a case, a part of the +1-order light and the −1-order light can be outputted without outputting the zero-order light.

Second Modification Example

Figure 27:
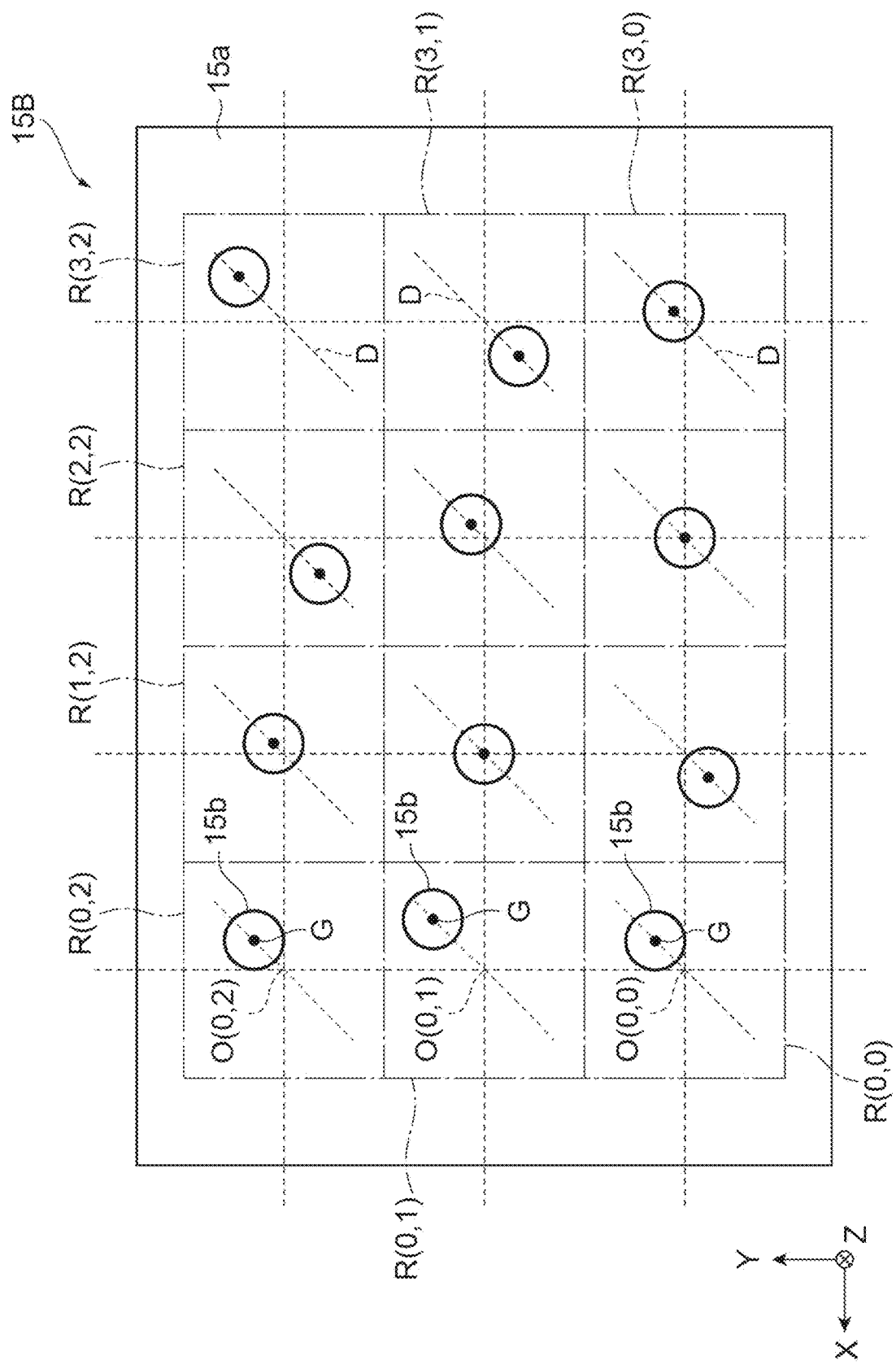
FIG. 27 is a plan view of a phase modulation layer 15B according to a second modification example.
Figure 28:
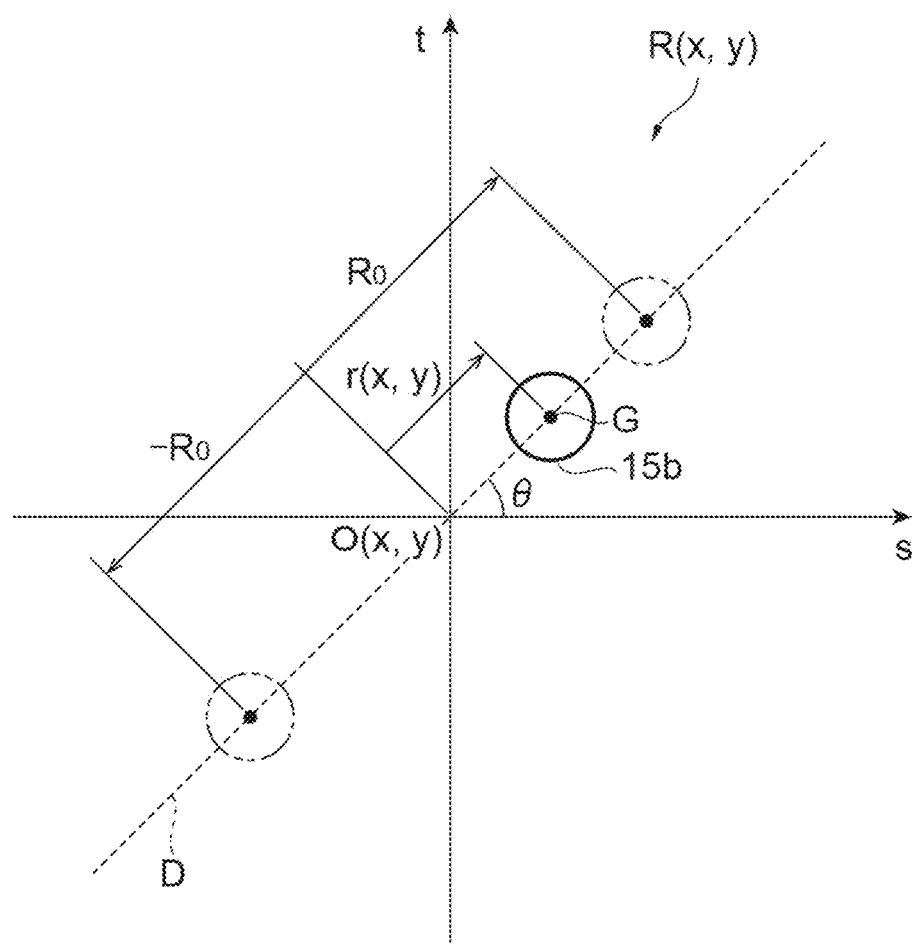
FIG. 28 is a diagram illustrating a positional relationship between modified refractive index regions 15b in a unit constituent region R in the phase modulation layer 15B.
Figure 29A:
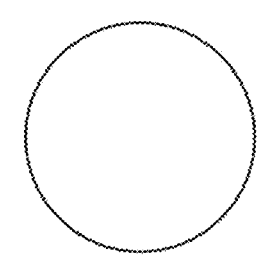
FIGS. 29A to 29G are plan views illustrating an example of a shape of the modified refractive index region 15b in an X-Y plane.
Figure 29B:
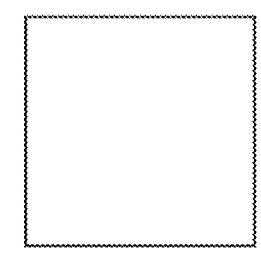
Figure 29C:
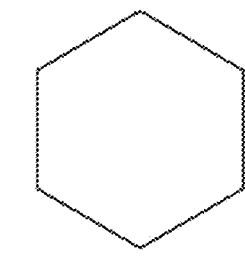
Figure 29D:
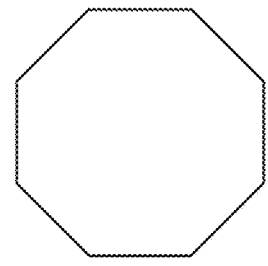
Figure 29E:
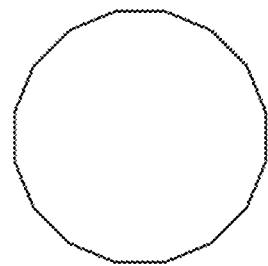
Figure 29F:
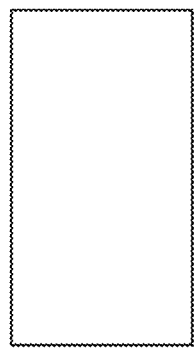
Figure 29G:
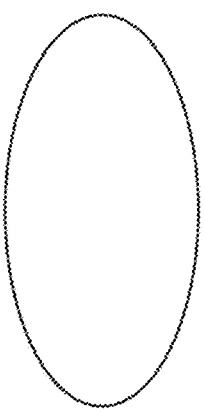

FIG. 27 is a plan view of a phase modulation layer 15B according to a second modification example of the above-described embodiment. FIG. 28 is a diagram illustrating a positional relationship between the modified refractive index regions 15b in the phase modulation layer 15B. As illustrated in FIGS. 27 and 28, the center of gravity G of each modified refractive index region 15b of the present modification example is arranged on a straight line D. The straight line D is a straight line that passes through the corresponding lattice point O(x, y) of the unit constituent region R(x, y) and is inclined with respect to each side of the square lattice. As illustrated in FIG. 28, each unit constituent region R is a region defined by the s-axis parallel to the X-axis and the t-axis parallel to the Y-axis. In other words, the straight line D set in each unit constituent region R is a straight line inclined with respect to both the X-axis and the Y-axis. An inclination angle of the straight line D with respect to one side (X-axis) of the square lattice is θ. The inclination angle θ is constant in the phase modulation layer 15B. The inclination angle θ satisfies 0°<θ<90°, and is θ=45° in one example. Alternatively, the inclination angle θ satisfies 180°<θ<270°, and is θ=225° in one example. When the inclination angle θ satisfies 0°<θ<90° or 180°<θ<270°, the straight line D extends from the first quadrant to the third quadrant of the coordinate plane defined by the X-axis and the Y-axis. Alternatively, the inclination angle θ satisfies 90°<θ<180°, and is θ=135° in one example. Alternatively, the inclination angle θ satisfies 270°<θ<360°, and is θ=315° in one example. When the inclination angle θ satisfies 90°<θ<180° or 270°<θ<360°, the straight line D extends from the second quadrant to the fourth quadrant of the coordinate plane defined by the X-axis and the Y-axis. Thus, the inclination angle θ is an angle excluding 0°, 90°, 180°, and 270°. Here, it is assumed that a distance between the lattice point O(x, y) and the center of gravity G is r(x, y). x indicates a position of an x-th lattice point on the X-axis, and y indicates a position of a y-th lattice point on the Y-axis. When the distance r(x, y) is a positive value, the center of gravity G is positioned in the first quadrant (or the second quadrant). When the distance r(x, y) is a negative value, the center of gravity G is positioned in the third quadrant (or the fourth quadrant). When the distance r(x, y) is 0, the lattice point O and the center of gravity G coincide with each other. The inclination angle is suitably 45°, 135°, 225°, and 275°.

The phase modulation is performed on only two of four wavenumber vectors forming standing waves at the point M (for example, the in-plane wavenumber vectors (±π/a, ±π/a)) at these angles, and the phase modulation is not performed on the other two. Thus, a stable standing waves can be formed. The inclination angle θ can be the same in the unit constituent regions R(x, y).

The distances r(x, y) between the centers of gravity G of the modified refractive index regions 15b and the corresponding lattice points O of the unit constituent regions R illustrated in FIG. 27 are set individually for each modified refractive index region 15b according to the phase pattern corresponding to the desired optical image. The phase pattern, that is, the distribution of the distances r(x, y) has a specific value for each position decided by the values of x and y, but may not be represented by a specific function. The distribution of the distances r(x, y) is decided from the phase distribution extracted from among the complex amplitude distributions obtained by performing the inverse Fourier transform on the desired optical image. That is, in the unit constituent region R(x, y) illustrated in FIG. 28, when the phase P(x, y) is $P_0$, the distance r(x, y) is set to 0. When the phase P(x, y) is n+$P_0$, the distance r(x, y) is set to a maximum value $R_0$. When the phase P(x, y) is −π+$P_0$, the distance r(x, y) is set to a minimum value −$R_0$. When the phase P(x, y) is an intermediate phase P(x, y) thereof, the distance r(x, y) is set such that r(x, y)={P(x, y)−$P_0$}×$R_0$/πht. A range of the phase P(x, y) is set so as to be an intermediate value between π+$P_0$ and −π+$P_0$. Here, an initial phase $P_0$ can be randomly set. It is assumed that the lattice spacing of the virtual square lattice is a, the maximum value $R_0$ of r(x, y) is, for example, within a range represented by the following Formula (31).

$$0 \leq R_0 \leq \frac{a}{\sqrt{2}} \qquad (31)$$

When the complex amplitude distributions are obtained from the desired optical image, reproducibility of the beam pattern can be improved by applying an iterative algorithm such as a Gerchberg-Saxton (GS) method that is commonly used in calculating a hologram.

In the present modification example, the desired optical image can be obtained by deciding the distribution of the distances r(x, y) in the modified refractive index regions 15b of the phase modulation layer 15B. Under the same first to fourth preconditions as those in the above-described embodiment, the phase modulation layer 15B is formed to satisfy the following conditions. That is, the corresponding modified refractive index region 15b is arranged in the unit constituent region R(x, y) such that the distance r(x, y) from the lattice point O(x, y) to the center of gravity G of the corresponding modified refractive index region 15b satisfies a relationship of the following formula.

$$r(x,y)=C\times(P(x,y)-P_0)$$

C: proportional constant, for example, $R_0/\pi$ $P_0$: arbitrary constant, for example, 0 That is, the distance r(x, y) is set to 0 when the phase P(x, y) is $P_0$ in the unit constituent region R(x, y), is set to the maximum value $R_0$ when the phase P(x, y) is n+$P_0$, and is set to the minimum value −$R_0$ when the phase P(x, y) is −π+$P_0$. A range of the phase P(x, y) is set so as to be an intermediate value between π+$P_0$ and −π+$P_0$. When there is an attempt to obtain the desired optical image, the inverse Fourier transform is performed on the optical image, and thus, the distribution of the distances r(x, y) corresponding to the phase P(x, y) of the complex amplitude may be given to the plurality of modified refractive index regions 15b. The phase P(x, y) and the distance r(x, y) may be proportional to each other.

Similar to the above-described embodiment, as a method of obtaining the intensity distribution and the phase distribution from the complex amplitude distributions obtained by the inverse Fourier transform, for example, the intensity distribution I(x, y) can be calculated by using the abs function of numerical analysis software "MATLAB" of MathWorks, and the phase distribution P(x, y) can be calculated by using the angle function of MATLAB. When the distance r(x, y) of each modified refractive index region 15b is decided by obtaining the phase distribution P(x, y) from the result of the inverse Fourier transform of the optical image, the points to be noted in the case of calculation using a general discrete Fourier transform (or fast Fourier transform) are the same as those in the above-described embodiment.

Similar to the above-described embodiment, in the present modification example, the lattice spacing a of the virtual square lattice and the emission wavelength λ of the active layer 12 satisfy the condition of the M-point oscillation. When the reciprocal lattice space is considered in the phase modulation layer 15B, the magnitude of at least one of the in-plane wavenumber vectors in the four directions each including the wavenumber spread due to the distribution of the distances r(x, y) is smaller than $2\pi/\lambda$. (light line).

More specifically, in the present modification example, the phase modulation layer 15B in the S-iPM laser oscillating at the point M is devised as follows, and thus, a part of the +1-order light and the −1-order light is outputted without outputting the zero-order light into the light line. Specifically, as illustrated in FIG. 16, the diffraction vector V having certain constant magnitude and orientation is added to the in-plane wavenumber vector K6 to K9, and thus, the magnitude of at least one of the in-plane wavenumber vectors K6 to K9 is set to be smaller than $2\pi/\lambda$. In other words, at least one of the in-plane wavenumber vectors K6 to K9 after the diffraction vector V is added is included in the circular region (light line) LL having a radius of $2\pi/\lambda$. That is, the diffraction vector V satisfying the above Formula (21) is added, and thus, any of the in-plane wavenumber vectors K6 to K9 is included in the light line LL. Accordingly, a part of the +1-order light and the −1-order light is outputted.

Alternatively, as illustrated in FIG. 26 of the above-described first modification example, the diffraction vector V is added to the wavenumber vector excluding the wave spread Δk from the wavenumber vectors K6 to K9 in the four directions (that is, the in-plane wavenumber vectors in the four directions in the square lattice PCSEL of the M-point oscillation, see FIG. 12), and thus, the magnitude of at least one of the in-plane wavenumber vectors K6 to K9 in the four directions may be set to be smaller than the value $\{(2\pi/\lambda)-\Delta k\}$ obtained by subtracting the wavenumber spread Δk from $2\pi/\lambda$. That is, the diffraction vector V satisfying the above Formula (30) is added, and thus, any of the in-plane wavenumber vectors K6 to K9 is included in the region LL2. Accordingly, a part of the +1-order light and the −1-order light is outputted.

A method of superimposing the distance distribution $r_2(x, y)$ (second phase distribution) unrelated to the optical image on the distance distribution $r_1(x, y)$ (first phase distribution) which is the phase distribution corresponding to the optical image is considered as an example of a specific method of adding the diffraction vector V to the in-plane wavenumber vectors K6 to K9. In this case, the distance distribution r(x, y) of the phase modulation layer 15B is represented as the following formula.

r(x, y)=$r_1$(x, y)+$r_2$(x, y) $r_1$(x, y) corresponds to the phase of the complex amplitude when the inverse Fourier transform is performed on the optical image as described above. $r_2$(x, y) is the distance distribution for adding the diffraction vector V satisfying the above Formula (30). A specific example of the distance distribution $r_2$(x, y) is the same as that in FIG. 18. When the distance distribution r(x, y) exceeds a range from $-R_0$ to $R_0$, the distance distribution may be converted by adding or subtracting $2R_0$ so as to have a value within this range.

In the present modification example, the center of gravity G of each modified refractive index region 15b is arranged on the straight line D that passes through the lattice point O of the virtual square lattice and is inclined with respect to the square lattice. The distance r(x, y) between the center of gravity G of each modified refractive index region 15b and the corresponding lattice point O is individually set according to the optical image. According to such a structure, similar to the above-described embodiment in which the center of gravity G of each modified refractive index region 15b has the rotation angle corresponding to the optical image around each lattice point O, the optical image in any shape can be outputted in the Z-axis direction, the direction inclined with respect to the Z-axis direction, or both the directions by using the S-iPM laser. In the present modification example, the lattice spacing a of the virtual square lattice and the emission wavelength λ of the active layer 12 satisfy the condition of the M-point oscillation, the phase modulation is performed on the plane waves that form the standing waves by the distribution of the distances r(x, y) in the reciprocal lattice space of the phase modulation layer 15B, and the magnitude of at least one of the in-plane wavenumber vectors K6 to K9 in the four directions each including the wavenumber spread Δk due to the angle spread of the optical image is set to be smaller than $2\pi/\lambda$ (light line). Alternatively, the diffraction vector V is added to the wavenumber vector excluding the wavenumber spread Δk from the wavenumber vectors K6 to K9 in the four directions, and thus, the magnitude of at least one in-plane wavenumber vector is set to be smaller than the value $\{(2\pi/\lambda)-\Delta k\}$ obtained by subtracting the wavenumber spread Δk from $2\pi/\lambda$. Accordingly, the zero-order light included in the output of the S-iPM laser can be removed from the light line, and only the signal light can be outputted.

Third Modification Example

FIGS. 29A to 29G and 30A to 30K are plan views illustrating an example of the shape of the modified refractive index region 15b in the X-Y plane. In the above-described embodiment and modification examples, an example in which the shape of the modified refractive index region 15b in the X-Y plane is circular is illustrated. However, the modified refractive index region 15b may have a shape other than the circle. For example, the shape of the modified refractive index region 15b in the X-Y plane may have mirror symmetry (line symmetry).

Here, the mirror symmetry (line symmetry), a planar shape of the modified refractive index region 15b positioned on one side of the straight line and a planar shape of the modified refractive index region 15b positioned on the other side of the straight line with a certain straight line along the X-Y plane interposed therebetween may be mirror-symmetrical (line-symmetrical) to each other. Examples of the shape having the mirror symmetry (line symmetry) include a perfect circle illustrated in FIG. 29A, a square illustrated in FIG. 29B, a regular hexagon illustrated in FIG. 29C, a regular octagon illustrated in FIG. 29D, a regular hexadecagon illustrated in FIG. 29E, a rectangle illustrated in FIG. 29F, and an ellipse illustrated in FIG. 29G Thus, the shape of the modified refractive index region 15b in the X-Y plane has mirror symmetry (line symmetry). In this case, since the modified refractive index region has a simple shape in each of the unit constituent regions R of the virtual square lattice of the phase modulation layer, the direction and position of the center of gravity G of the corresponding modified refractive index region 15b from the lattice point O are decided with high accuracy, and thus, patterning can be performed with high accuracy.

Figure 30A:
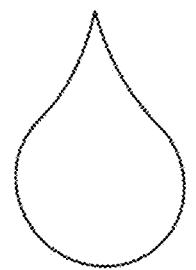
FIGS. 30A to 30K are plan views illustrating an example of the shape of the modified refractive index region 15b in the X-Y plane.
Figure 30B:
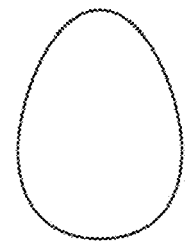
Figure 30C:
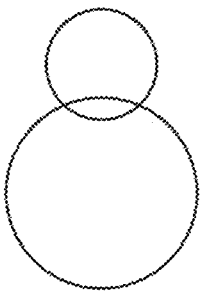
Figure 30D:
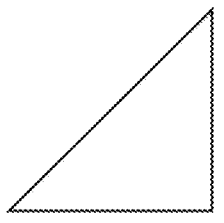
Figure 30E:
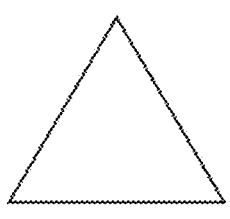
Figure 30F:
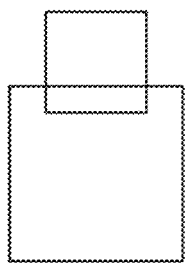
Figure 30G:
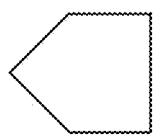
Figure 30H:
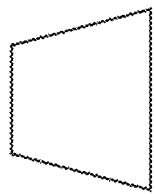
Figure 30I:
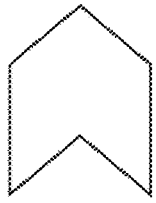
Figure 30J:
Figure 30K:
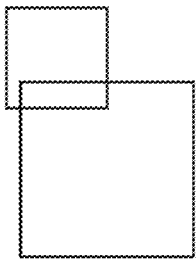

The shape of the modified refractive index region 15b in the X-Y plane may be a shape having no rotational symmetry of 180°. Examples of such a shape include a regular triangle illustrated in FIG. 30A, an isosceles right triangle illustrated in FIG. 30B, a shape in which portions of two circles or ellipses are overlapped as illustrated in FIG. 30C, a shape (egg shape) in which the ellipse is deformed such that a dimension near one end portion of an ellipse along a major axis in a minor axis direction is smaller than a dimension near the other end portion in the minor axis direction as illustrated in FIG. 30D, a shape (teardrop shape) in which one end portion along the major axis of the ellipse is deformed to a sharp end portion protruding along the major axis direction as illustrated in FIG. 30E, an isosceles triangle illustrated in FIG. 30F, a shape (arrow shape) in which one side of a rectangle is recessed in a triangle shape and one side opposing the recessed side is sharp in a triangle shape as illustrated in FIG. 30G, a trapezoid illustrated in FIG. 30H, a pentagon illustrated in FIG. 30I, a shape in which portions of two rectangles are overlapped as illustrated in FIG. 30J, and a shape in which portions of the two rectangles are overlapped and which has no mirror symmetry as illustrated in FIG. 30K. As described above, since the shape of the modified refractive index region 15b in the X-Y plane has no rotational symmetry of 180°, a higher light output can be obtained.

FIGS. 31A to 31K and 32 are plan views illustrating another example of the shape of the modified refractive index region in the X-Y plane. In this example, a plurality of modified refractive index regions 15c different from the plurality of modified refractive index regions 15b is further provided. Each modified refractive index region 15c is comprised of a second refractive index medium having a refractive index different from that of the first refractive index medium of the base layer 15a. Similar to the modified refractive index region 15b, the modified refractive index region 15c may be an empty hole, or a compound semiconductor may be embedded in the empty hole. The modified refractive index regions 15c are provided in a one-to-one correspondence with the modified refractive index regions 15b. A center of gravity G of the modified refractive index regions 15b and 15c is positioned on a straight line D that crosses the lattice point O of the unit constituent region R constituting the virtual square lattice. Both of the modified refractive index regions 15b and 15c are included in the range of the unit constituent region R constituting the virtual square lattice. The unit constituent region R is a region surrounded by a straight line that bisects the lattice points of the virtual square lattice.

Although the planar shape of the modified refractive index region 15c is, for example, the circle, the modified refractive index region may have various shapes similar to the modified refractive index region 15b. FIGS. 31A to 31K illustrate examples of the shapes and relative relationship of the modified refractive index regions 15b and 15c in the X-Y plane. Fogs. 31A and 31B illustrate a form in which the modified refractive index regions 15b and 15c have figures having the same shape. FIGS. 31C and 31D illustrate a form in which the modified refractive index regions 15b and 15c have figures having the same shape and portions thereof are overlapped with each other. FIG. 31E illustrates a form in which the modified refractive index regions 15b and 15c have figures having the same shape and are rotated. FIG. 31F illustrates a form in which the modified refractive index regions 15b and 15c have figures having different shapes. FIG. 31G illustrates a form in which the modified refractive index regions 15b and 15c have figures having different shapes and the modified refractive index regions 15b and 15c are separated from each other.

As illustrated in FIGS. 31H to 31K, the modified refractive index region 15b may include two regions 15b1 and 15b2 separated from each other. At this time, it is considered that the center of gravity of the regions 15b1 and 15b2 corresponds to the center of gravity of the single modified refractive index region 15b. In this case, as illustrated in FIGS. 31H and 31K, the regions 15b1 and 15b2 and the modified refractive index region 15c may have figures having the same shape as each other. Alternatively, as illustrated in FIGS. 31I and 31J, two figures of the regions 15b1 and 15b2 and the modified refractive index region 15c may be different from the others.

Figure 32:
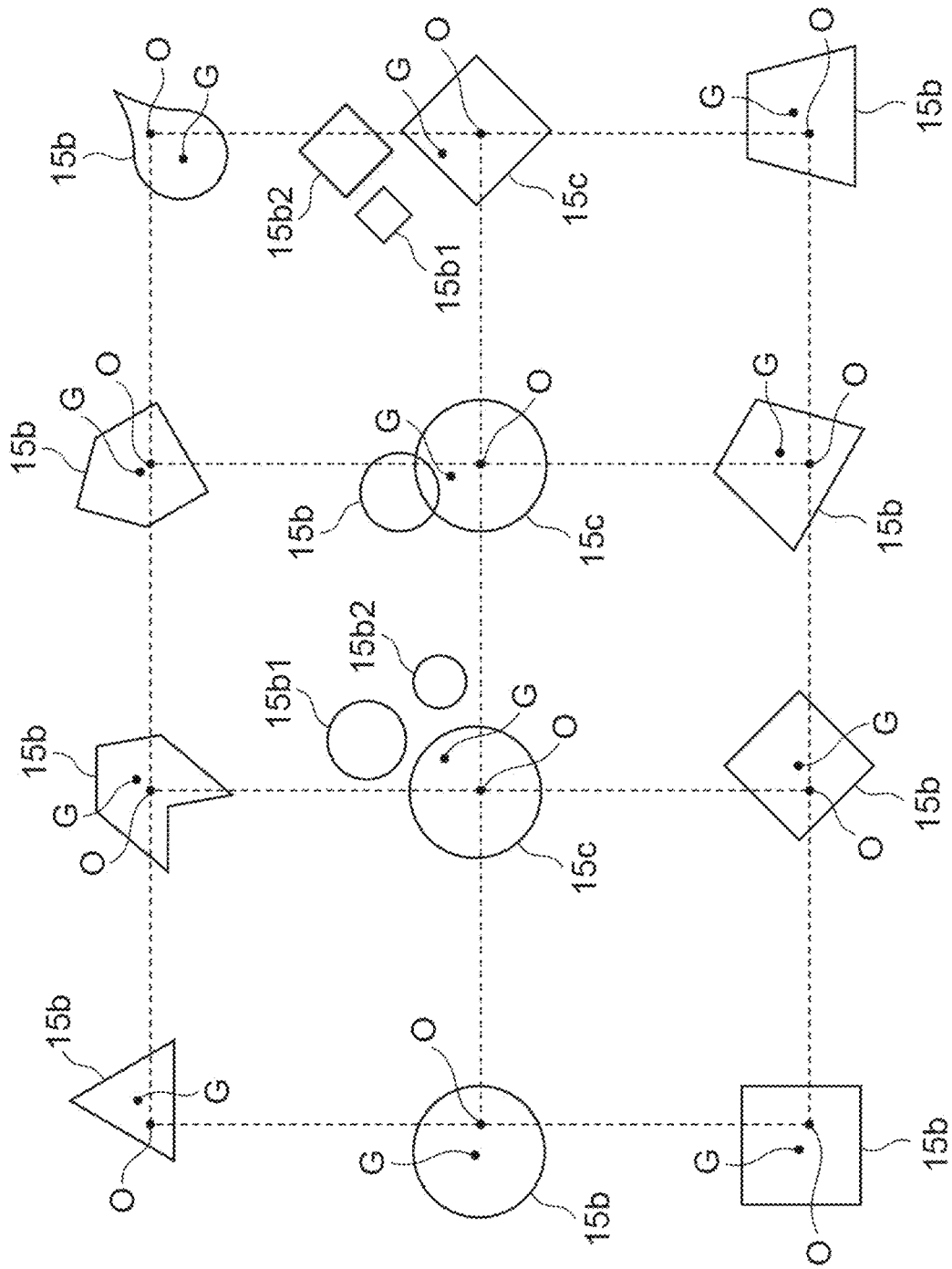
FIG. 32 is a plan view illustrating another example of the shape of the modified refractive index region in the X-Y plane.

The shape of the modified refractive index region in the X-Y plane may be the same between the lattice points. That is, the modified refractive index regions may have the same figure at all the lattice points, and may be superimposed on each other between the lattice points by a translation operation or a translation operation and a rotation operation. In this case, a variation in the phase angle due to a variation in the shape can be suppressed, and the beam pattern can be emitted with high accuracy. Alternatively, the shapes of the modified refractive index regions in the X-Y plane may not be the same between the lattice points, and the shapes may differ from each other between the adjacent lattice points, for example, as illustrated in FIG. 32.

Fourth Modification Example

Figure 33:
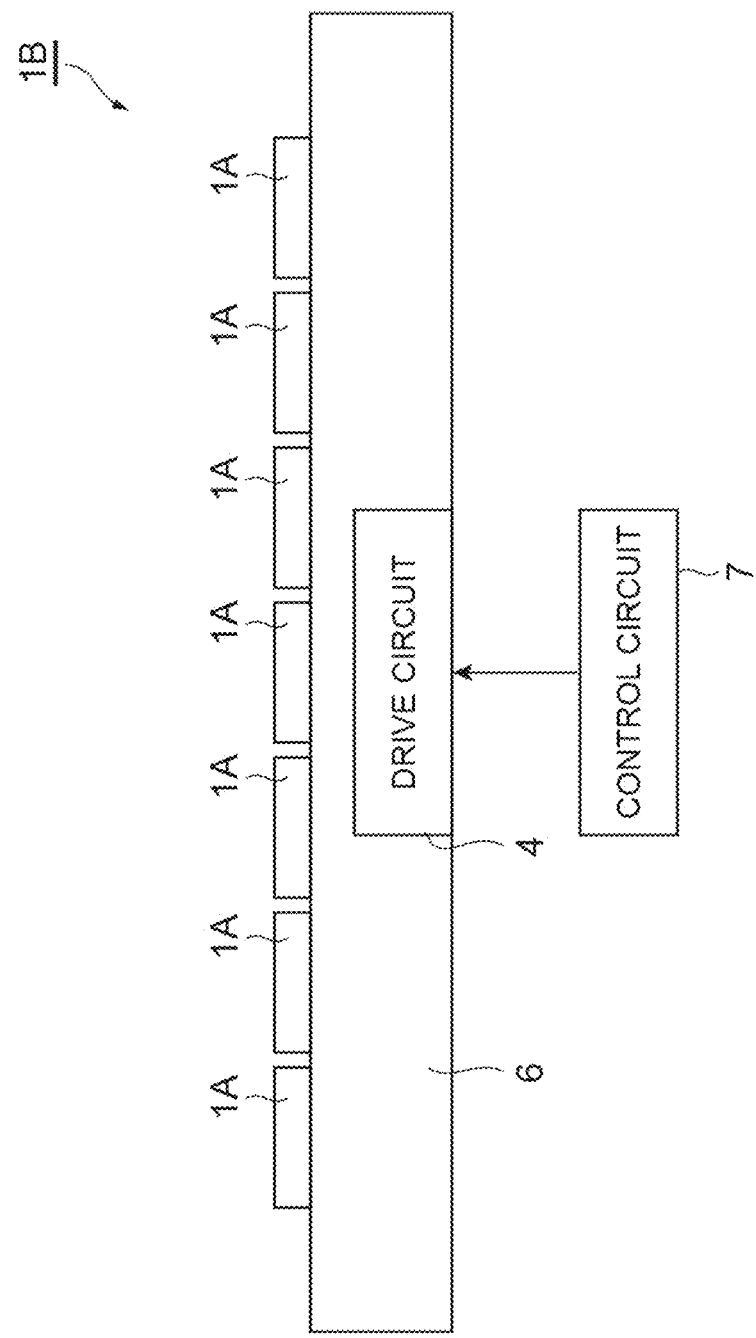
FIG. 33 is a diagram illustrating a configuration of a light emission device 1B according to a fourth modification example.

FIG. 33 is a diagram illustrating a configuration of a light emission device 1B according to a fourth modification example. The light emission device 1B includes a support substrate 6, a plurality of semiconductor light emission elements 1A arranged in a one-dimensional or two-dimensional shape on the support substrate 6, and a drive circuit 4 for individually driving the plurality of semiconductor light emission elements 1A. The configuration of each semiconductor light emission element 1A is the same as that in the above-described embodiment. However, the plurality of semiconductor light emission elements 1A may include a laser element that outputs an optical image in a red wavelength range, a laser element that outputs an optical image in a blue wavelength range, and a laser element that outputs an optical image in a green wavelength range. The laser element that outputs the optical image in the red wavelength range is comprised of, for example, a GaAs-based semiconductor. The laser element that outputs the optical image in the blue wavelength range and the laser element that outputs the optical image in the green wavelength range are comprised of, for example, a nitride-based semiconductor. The drive circuit 4 is provided on a back surface or an inside of the support substrate 6 and individually drives the semiconductor light emission elements 1A. The drive circuit 4 supplies drive currents to the individual semiconductor light emission elements 1A according to an instruction from a control circuit 7.

As in the present modification example, a head-up display or the like can be suitably realized by appropriately driving a necessary element for a module in which the semiconductor light emission elements corresponding to a plurality of patterns in advance are lined up by providing the plurality of semiconductor light emission elements 1A individually driven and extracting the desired optical image from each semiconductor light emission element 1A. A color head-up display or the like can be suitably realized by including the laser element that outputs the optical image in the red wavelength range, the laser element that outputs the optical image in the blue wavelength range, and the laser element that outputs the optical image in the green wavelength range in the plurality of semiconductor light emission elements 1A.

The light emission device of the present disclosure is not limited to the above-described embodiment, and various other modifications can be made. For example, although the laser element comprised of the GaAs-based, InP-based, and nitride-based (particularly, GaN-based) compound semiconductor is exemplified in the above-described embodiment, the present invention can be applied to laser elements comprised of other various semiconductor materials.

Although it has been described in the above-described embodiment that the active layer provided on the semiconductor substrate common to the phase modulation layer is used as the light emission portion, the light emission portion may be provided separately from the semiconductor substrate in the present invention. As long as the light emission portion is optically coupled to the phase modulation layer and supplies light to the phase modulation layer, the same effect as that of the above-described embodiment can be suitably exhibited even with such a configuration.

REFERENCE SIGNS LIST

1A . . . Semiconductor light emission element (light emission device); 1B . . . Light emission device; 4 . . . Drive circuit; 6 . . . Support substrate; 7 . . . Control circuit; 10 . . . Semiconductor substrate; 10a . . . Main surface; 10b . . . Back surface; 11, 13 . . . Cladding layer; 12 . . . Active layer; 14 . . . Contact layer; 15A, 15B . . . Phase modulation layer; 15a . . . base layer; 15b, 15c . . . Modified refractive index region; 16, 17 . . . Electrode; 17a . . . Opening; 18 . . . Protective film; 19 . . . Antireflection film; B1 . . . Basic reciprocal lattice vector; FR . . . Image region; G . . . Center of gravity; K1 to K9 . . . In-plane wavenumber vector; Ka . . . Wavenumber vector; Kb . . . In-plane wavenumber vector; LL . . . Light line; LL2 . . . Circular region; LM1, LM2 . . . Optical image portion; O . . . Lattice point; P . . . Reciprocal lattice point; R . . . Unit constituent region; RIN . . . Inner region; ROUT . . . Outer region; V . . . Diffraction vector; and $\varphi_A$, $\varphi_B$ . . . Phase value.

The invention claimed is:

1. A light emission device configured to output light forming an optical image along a normal direction of a main surface of a substrate, an inclination direction intersecting the normal direction, or both the normal direction and the inclination direction, the light emission device comprising:

a light emission portion; and a phase modulation layer provided on the substrate, the phase modulation layer being optically coupled to the light emission portion, wherein the phase modulation layer includes a base layer and a plurality of modified refractive index regions provided in the base layer so as to be distributed in a two-dimensional shape on a plane perpendicular to the normal direction, the plurality of modified refractive index regions having a refractive index different from a refractive index of the base layer, in a state in which a virtual square lattice is set on the plane, the plurality of modified refractive index regions is arranged in a state of being separated from lattice points corresponding to centers of gravity of the plurality of modified refractive index regions by a predetermined distance, and a rotation angle being around each lattice point in the virtual square lattice is set according to a phase distribution for forming the optical image, the rotation angle being a rotation angle of a line segment connecting the center of gravity of each of the plurality of modified refractive index regions and the corresponding lattice point with respect to the virtual square lattice, a lattice spacing a of the virtual square lattice and an emission wavelength $\lambda$, of the light emission portion are set so as to satisfy an oscillation condition at an M point of symmetric points in a reciprocal lattice space corresponding to a wavenumber space of the phase modulation layer, and a magnitude of at least one first in-plane wavenumber vector, out of first in-plane wavenumber vectors in four directions formed in the reciprocal lattice space of the phase modulation layer, is smaller than $2\pi/\lambda$.

2. A light emission device configured to output light forming an optical image along a normal direction of a main surface of a substrate, an inclination direction intersecting the normal direction, or both the normal direction and the inclination direction, the light emission device comprising:

a light emission portion; and a phase modulation layer provided on the substrate, the phase modulation layer being optically coupled to the light emission portion, wherein the phase modulation layer includes a base layer, and a plurality of modified refractive index regions provided in the base layer so as to be distributed in a two-dimensional shape on a plane perpendicular to the normal direction, the plurality of modified refractive index regions having a refractive index different from a refractive index of the base layer, in a state in which a virtual square lattice is set on the plane, the plurality of modified refractive index regions is arranged such that a center of gravity of each of the plurality of modified refractive index regions passes through a corresponding lattice point and is positioned on a straight line inclined with respect to the virtual square lattice, and a distance along the straight line between the center of gravity of each of the plurality of modified refractive index regions and the corresponding lattice point is set according to a phase distribution for forming the optical image, a lattice spacing a of the virtual square lattice and an emission wavelength $\lambda$, of the light emission portion are set so as to satisfy an oscillation condition at an M point of symmetric points in a reciprocal lattice space corresponding to a wavenumber space of the phase modulation layer, and a magnitude of at least one first in-plane wavenumber vector, out of first in-plane wavenumber vectors in four directions formed in the reciprocal lattice space of the phase modulation layer, is smaller than $2\pi/\lambda$.

3. The light emission device according to claim 1,
wherein the phase distribution is a phase distribution in which a first phase distribution for forming the optical image and a second phase distribution unrelated to the formation of the optical image are superimposed,
the second phase distribution is a phase distribution for adding a diffraction vector having certain constant magnitude and orientation to second in-plane wavenumber vectors in four directions in the first phase distribution formed in the reciprocal lattice space of the phase modulation layer, the second in-plane wavenumber vectors in four directions each including a wavenumber spread corresponding to an angle spread of output light forming the optical image, and
a magnitude of at least one third in-plane wavenumber vector, out of third in-plane wavenumber vectors in four directions corresponding to the first in-plane wavenumber vectors in the four directions, is set to be smaller than $2\pi/\lambda$, the third in-plane wavenumber vectors in the four directions being obtained by adding the diffraction vector to the second in-plane wavenumber vectors in the four directions.

4. The light emission device according to claim 1,
wherein the phase distribution is a phase distribution in which a first phase distribution for forming the optical image and a second phase distribution unrelated to the formation of the optical image are superimposed,
the second phase distribution is a phase distribution for adding a diffraction vector having certain constant magnitude and orientation to second in-plane wavenumber vectors in four directions of the first phase distribution formed in the reciprocal lattice space of the phase modulation layer without including a wavenumber spread corresponding to an angle spread of output light forming the optical image, and
a magnitude of at least one third in-plane wavenumber vector, out of third in-plane wavenumber vectors in four directions corresponding to the first in-plane wavenumber vectors in the four directions, is smaller than a value obtained by subtracting the wavenumber spread from $2\pi/\lambda$, the third in-plane wavenumber vectors in the four directions being obtained by adding the diffraction vector to the second in-plane wavenumber vectors in the four directions.

5. The light emission device according to claim 3,
wherein the second phase distribution is a distribution in which first phase values and second phase values different from the first phase values are alternately arranged along two directions orthogonal to each other.

6. The light emission device according to claim 5,
wherein the second phase distribution is a distribution in which the first phase values and the second phase values different from the first phase values change by $\pi$.

7. The light emission device according to claim 4,
wherein the second phase distribution is a distribution in which first phase values and second phase values different from the first phase values are alternately arranged along two directions orthogonal to each other.

8. The light emission device according to claim 7,
wherein the second phase distribution is a distribution in which the first phase values and the second phase values different from the first phase values change by $\pi$.

9. The light emission device according to claim 2,
wherein the phase distribution is a phase distribution in which a first phase distribution for forming the optical image and a second phase distribution unrelated to the formation of the optical image are superimposed,
the second phase distribution is a phase distribution for adding a diffraction vector having certain constant magnitude and orientation to second in-plane wavenumber vectors in four directions in the first phase distribution formed in the reciprocal lattice space of the phase modulation layer, the second in-plane wavenumber vectors in four directions each including a wavenumber spread corresponding to an angle spread of output light forming the optical image, and
a magnitude of at least one third in-plane wavenumber vector, out of third in-plane wavenumber vectors in four directions corresponding to the first in-plane wavenumber vectors in the four directions, is set to be smaller than $2\pi/\lambda$, the third in-plane wavenumber vectors in the four directions being obtained by adding the diffraction vector to the second in-plane wavenumber vectors in the four directions.

10. The light emission device according to claim 2,
wherein the phase distribution is a phase distribution in which a first phase distribution for forming the optical image and a second phase distribution unrelated to the formation of the optical image are superimposed,
the second phase distribution is a phase distribution for adding a diffraction vector having certain constant magnitude and orientation to second in-plane wavenumber vectors in four directions of the first phase distribution formed in the reciprocal lattice space of the phase modulation layer without including a wavenumber spread corresponding to an angle spread of output light forming the optical image, and
a magnitude of at least one third in-plane wavenumber vector, out of third in-plane wavenumber vectors in four directions corresponding to the first in-plane wavenumber vectors in the four directions, is smaller than a value obtained by subtracting the wavenumber spread from $2\pi/\lambda$, the third in-plane wavenumber vectors in the four directions being obtained by adding the diffraction vector to the second in-plane wavenumber vectors in the four directions.

11. The light emission device according to claim 9,
wherein the second phase distribution is a distribution in which first phase values and second phase values different from the first phase values are alternately arranged along two directions orthogonal to each other.

12. The light emission device according to claim 11,
wherein the second phase distribution is a distribution in which the first phase values and the second phase values different from the first phase values change by $\pi$.

13. The light emission device according to claim 10,
wherein the second phase distribution is a distribution in which first phase values and second phase values different from the first phase values are alternately arranged along two directions orthogonal to each other.

14. The light emission device according to claim 13,
wherein the second phase distribution is a distribution in which the first phase values and the second phase values different from the first phase values change by $\pi$.

* * * * *